United States Patent
Kim

(10) Patent No.: US 10,181,500 B2
(45) Date of Patent: Jan. 15, 2019

(54) DISPLAY DEVICE AND METHOD OF MANUFACTURING THE SAME

(71) Applicant: LG Display Co., Ltd., Seoul (KR)

(72) Inventor: JongSung Kim, Paju-si (KR)

(73) Assignee: LG Display Co., Ltd., Seoul (KR)

( * ) Notice: Subject to any disclaimer, the term of this patent is extended or adjusted under 35 U.S.C. 154(b) by 0 days.

(21) Appl. No.: 15/391,756

(22) Filed: Dec. 27, 2016

(65) Prior Publication Data

US 2018/0061894 A1 Mar. 1, 2018

(30) Foreign Application Priority Data

Aug. 31, 2016 (KR) .................. 10-2016-0111872
Oct. 25, 2016 (KR) .................. 10-2016-0139009

(51) Int. Cl.
| H01L 33/00 | (2010.01) |
| H01L 27/32 | (2006.01) |
| H01L 51/52 | (2006.01) |
| G03F 7/00 | (2006.01) |

(52) U.S. Cl.
CPC .......... *H01L 27/322* (2013.01); *G03F 7/0007* (2013.01); *H01L 27/3213* (2013.01); *H01L 27/3244* (2013.01); *H01L 51/5253* (2013.01); *H01L 51/5268* (2013.01); *H01L 51/5284* (2013.01); *H01L 2227/323* (2013.01); *H01L 2251/305* (2013.01); *H01L 2251/308* (2013.01)

(58) Field of Classification Search
CPC ... G02F 2001/136222; G02F 1/136209; H01L 27/3248; H01L 51/50–51/56; H01L 27/32–27/3297

USPC ........................................................ 257/89
See application file for complete search history.

(56) References Cited

U.S. PATENT DOCUMENTS

| 4,673,253 | A | 6/1987 | Tanabe et al. |
| 7,928,646 | B2 * | 4/2011 | Ryuji .................. H01L 27/322 313/501 |
| 2009/0147188 | A1 | 6/2009 | Yang et al. |
| 2010/0232162 | A1* | 9/2010 | Shin .................... H01L 27/322 362/293 |
| 2011/0042697 | A1 | 2/2011 | Lee et al. |
| 2012/0223979 | A1 | 9/2012 | Matsukura |

(Continued)

FOREIGN PATENT DOCUMENTS

| JP | S6177804 A | 4/1986 |
| JP | 2002305295 | 10/2002 |

(Continued)

OTHER PUBLICATIONS

Office Action for Korean Patent Application No. KR 2016-0139009, dated Oct. 20, 2017, 9 Pages (With Concise Explanation of Relevance).

(Continued)

*Primary Examiner* — Kevin M Picardat
(74) *Attorney, Agent, or Firm* — Fenwick & West LLP

(57) ABSTRACT

Disclosed are a display device and a method of manufacturing the same, which prevent a reduction in an aperture ratio and occurrence of color mixing caused by a process error of a black matrix and a color filter. The display device includes a plurality of color filters, an inorganic layer covering the plurality of color filters, and a black matrix disposed on the inorganic layer between the plurality of color filters.

22 Claims, 39 Drawing Sheets

(56) References Cited

U.S. PATENT DOCUMENTS

| | | | |
|---|---|---|---|
| 2013/0050864 A1 | 2/2013 | Lin | |
| 2013/0320842 A1 | 12/2013 | Park et al. | |
| 2014/0061597 A1 | 3/2014 | Choi et al. | |
| 2014/0145159 A1 | 5/2014 | Kim et al. | |
| 2014/0190621 A1* | 7/2014 | Kawata | B32B 38/10 156/155 |
| 2015/0090991 A1 | 4/2015 | Ishii et al. | |
| 2015/0255520 A1* | 9/2015 | Seo | H01L 27/3213 257/89 |
| 2015/0318339 A1* | 11/2015 | Nakamura | H01L 27/3262 257/98 |
| 2016/0033814 A1* | 2/2016 | Na | G02F 1/133305 349/106 |
| 2017/0125508 A1* | 5/2017 | Kim | H01L 27/322 |
| 2017/0154927 A1* | 6/2017 | Jo | H01L 27/288 |

FOREIGN PATENT DOCUMENTS

| | | |
|---|---|---|
| JP | 201320744 A | 1/2013 |
| JP | 201426831 A | 2/2014 |
| JP | 201449436 A | 3/2014 |
| JP | 2014107266 A | 6/2014 |
| JP | 201569861 A | 4/2015 |
| JP | 201572827 A | 4/2015 |
| KR | 20110018785 | 2/2011 |
| KR | 20140013988 | 2/2014 |
| KR | 20160007658 | 1/2016 |
| WO | WO 00/33131 | 6/2000 |
| WO | WO 2014175681 | 10/2014 |

OTHER PUBLICATIONS

Preliminary Notice of Reasons for Rejection for Japanese Patent Application No. JP 2016-239988, dated Dec. 5, 2017, 5 Pages, (With Concise Explanation of Relevance).
Extended European Search Report for European Patent Application No. EP 16206955.3, dated Nov. 29, 2017, 14 Pages.
Partial European Search Report for European Patent Application No. EP 16206955.3, dated Jul. 14, 2017, 11 Pages.

* cited by examiner

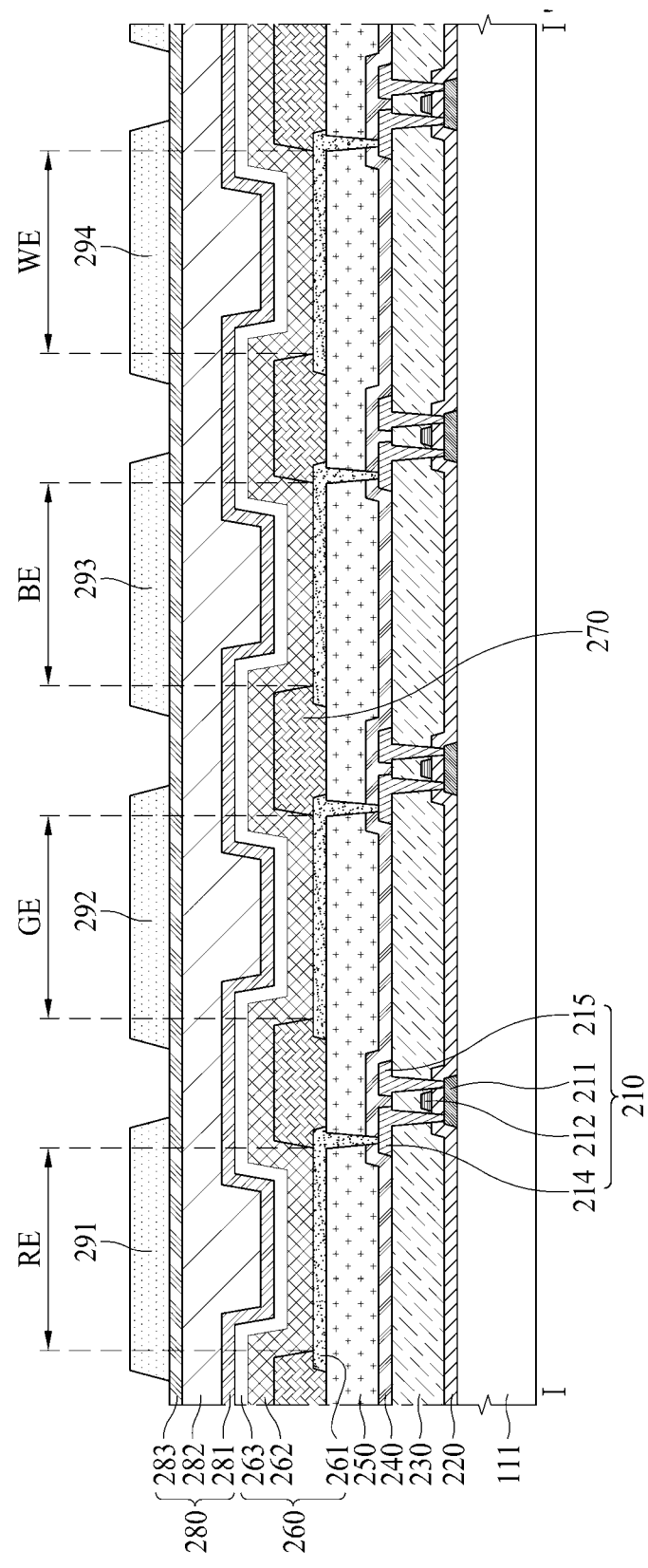

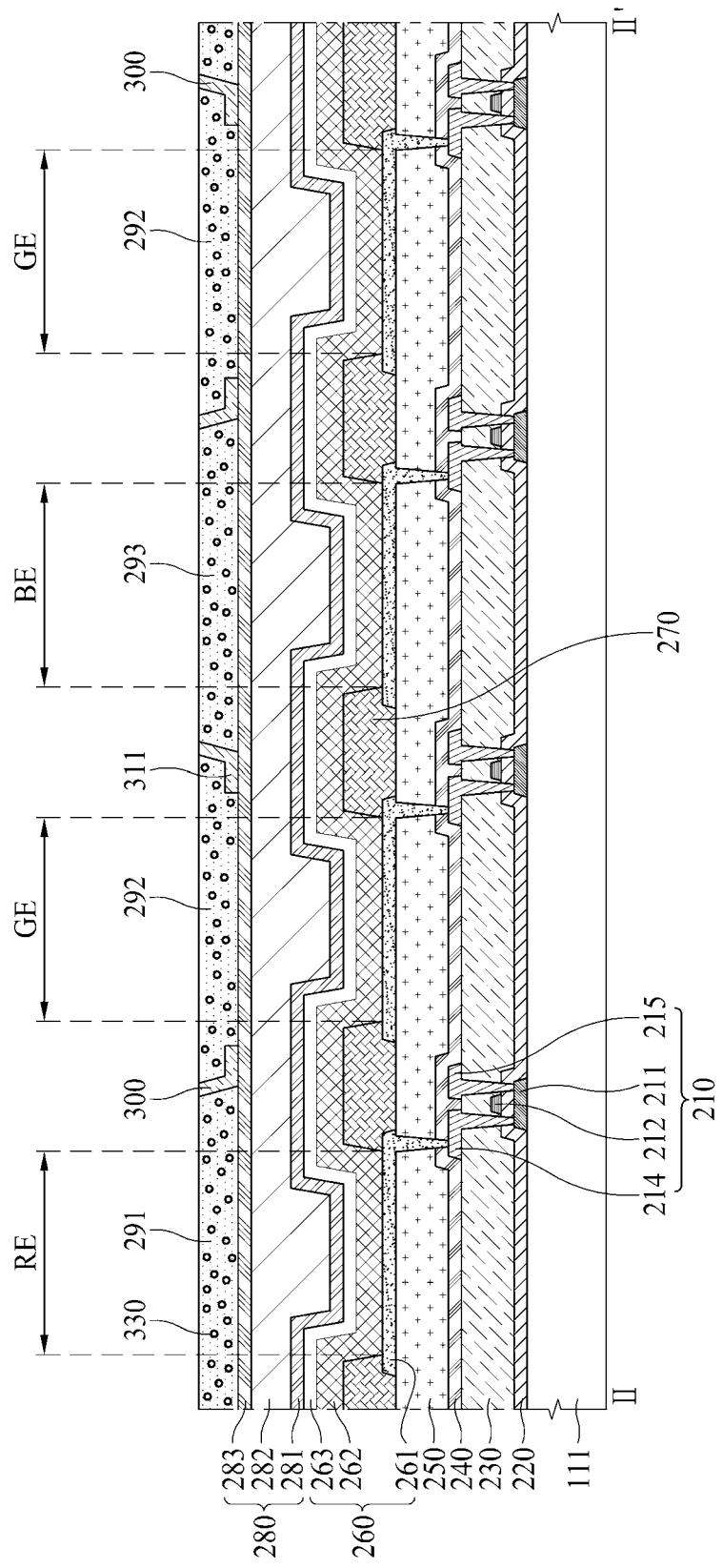

DISPLAY DEVICE AND METHOD OF MANUFACTURING THE SAME

CROSS-REFERENCE TO RELATED APPLICATIONS

This application claims the benefit of Republic of Korea Patent Application No. 10-2016-0111872 filed on Aug. 31, 2016 and Republic of Korea Patent Application No. 10-2016-0139009 filed on Oct. 25, 2016, both of which are hereby incorporated by reference as if fully set forth herein.

BACKGROUND

Field

The present disclosure relates to a display device and a method of manufacturing the same.

Discussion of the Related Art

With the advancement of information-oriented society, various requirements for display devices for displaying an image are increasing. Therefore, various display devices such as liquid crystal display (LCD) devices, plasma display panel (PDP) devices, organic light emitting display devices, etc. are being used recently.

As a type of display device, organic light emitting display devices are self-emitting display devices and have better viewing angle and contrast ratio than LCD devices. Also, since the organic light emitting display devices do not need a separate backlight, it is possible to make lighter and thinner the organic light emitting display devices, and the organic light emitting display devices are excellent in power consumption. Furthermore, the organic light emitting display devices are driven with a low direct current (DC) voltage, have a fast response time, and are low in manufacturing cost.

The organic light emitting display devices each include a plurality of pixels, each including an organic light emitting device, and a bank that divides the pixels for defining the pixels. The bank may act as a pixel defining layer. The organic light emitting device includes an anode electrode, a hole transporting layer, an organic light emitting layer, and an electron transporting layer, and a cathode electrode. In this case, when a high-level voltage is applied to the anode electrode and a low-level voltage is applied to the cathode electrode, a hole and an electron respectively move to the organic light emitting layer through the hole transporting layer and the electron transporting layer and are combined with each other in the organic light emitting layer to emit light.

Examples of the organic light emitting device may include a red organic light emitting device emitting red light, a green organic light emitting device emitting green light, and a blue organic light emitting device emitting blue light, or may include only a white organic light emitting device emitting white light. If the organic light emitting device includes only the white organic light emitting device, red, green, and blue color filters for respectively realizing red, green, and blue colors are needed. The color filters and a black matrix that divides the color filters are formed through a photolithography process. In this case, however, due to an error of the photolithography process, an aperture ratio is reduced, and mixing of colors occurs.

FIGS. 1A to 1C are exemplary diagrams illustrating in detail a reduction in an aperture ratio and occurrence of color mixing caused by a process error of a black matrix, a color filter, and a bank. In FIGS. 1A to 1C, convenience of description, an anode electrode AND, an organic light emitting layer OL, a cathode electrode CAT, a bank BANK, a black matrix BM, and first and second color filters CF1 and CF2 are exemplarily illustrated.

FIG. 1A illustrates a case where the bank BANK, the black matrix BM, and the first and second color filters CF1 and CF2 are normally formed without a process error, and FIG. 1B illustrates a case where the bank BANK and the first color filter CF1 are mainly disposed on the right, the black matrix BM and the second color filter CF2 are mainly disposed on the left, and a width w2 of the black matrix BM is formed wider than an originally desired width w1. In FIG. 1B, the black matrix BM extends out of the boundary for the bank BANK and overlaps an emissive area EA. For this reason, an aperture ratio of the emissive area EA is lowered.

FIG. 1C illustrates a case where the bank BANK, the black matrix BM, and the first color filter CF1 are mainly disposed on the right, the second color filter CF2 is mainly disposed on the left, and a width w3 of the black matrix BM is formed narrower than the originally desired width w1. In FIG. 1C, the black matrix BM does not cover an area where the first and second color filters CF1 and CF2 overlap each other. For this reason, color mixing can occur due to light L passing through the area where the first and second color filters CF1 and CF2 overlap each other.

That is, due to a process error of the black matrix BM and the color filters CF1 and CF2, an aperture ratio of the emissive area EA can be reduced, or color mixing can occur.

SUMMARY

Accordingly, the present disclosure is directed to provide a display device and a method of manufacturing the same that substantially obviate one or more problems due to limitations and disadvantages of the related art.

An aspect of the present disclosure is directed to provide a display device and a method of manufacturing the same, which prevent a reduction in an aperture ratio and occurrence of color mixing caused by a process error of a black matrix and a color filter.

Additional advantages and features of the invention will be set forth in part in the description which follows and in part will become apparent to those having ordinary skill in the art upon examination of the following or may be learned from practice of the invention. The objectives and other advantages of the invention may be realized and attained by the structure particularly pointed out in the written description and claims hereof as well as the appended drawings.

To achieve these and other advantages and in accordance with the purpose of the invention, as embodied and broadly described herein, there is provided a display device including a plurality of color filters, an inorganic layer covering the plurality of color filters, and a black matrix on the inorganic layer between the plurality of color filters.

In another aspect of the present disclosure, there is provided a display device including first and third color filters spaced apart from each other, an inorganic layer covering the first and third color filters and disposed in a space between the first and third color filters, and a second color filter on the inorganic layer in the space between the first and third color filters.

In another aspect of the present disclosure, there is provided a display device including a first color filter, a second color filter adjacent to the first color filter, and a black matrix between the first color filter and the second color filter, the black matrix including a reflective metal.

Embodiments also relate to a display device. The display device includes a first substrate, a second substrate facing the first substrate, and an array of subpixels disposed on the first substrate. The array of subpixels includes at least a first subpixel and a second subpixel adjacent to the first subpixel. The display device also includes a first color filter on the first subpixel and a second color filter on the second subpixel, wherein the first color filter is physically separated from the second color filter. The display device also includes an inorganic layer disposed on the first color filter and the second color filter and in an area between the first color filter and the second color filter, and a black matrix disposed on the inorganic layer in the area between the first color filter and the second color filter.

Embodiments also relate to a display device. The display device includes a first substrate, a second substrate facing the first substrate, and an array of subpixels disposed on the first substrate. The array of subpixels includes at least a first subpixel, a second subpixel adjacent to the first subpixel, and a third subpixel adjacent to the second subpixel. The display device also includes a first color filter on the first subpixel, a second color filter on the second subpixel, and a third color filter on the third subpixel. The display device also includes a protective layer that includes a first part disposed between the first color filter and the second color filter and below at least a portion of the second color filter. The first part physically separates the first color filter from the second color filter. The protective layer also includes a second part disposed between the second color filter and the third color filter and below at least another portion of the second color filter. The second part physically separates the second color filter from the third color filter.

Embodiments also relate to a display device. The display device includes a first substrate, a second substrate facing the first substrate, and an array of subpixels disposed on the first substrate. The array of subpixels includes at least a first subpixel, a second subpixel adjacent to the first subpixel, and a third subpixel adjacent to the second subpixel. The display device also includes a first color filter on the first subpixel, a second color filter on the second subpixel, and a third color filter on the third subpixel. The display device also includes a protective layer disposed between the first color filter and the second color filter, and between the second color filter and the third color filter, and below at least one of the first color filter, the second color filter, and the third color filter.

Embodiments also relate to a method of manufacturing a display device. An array of subpixels is formed on a first surface of a first substrate. The array of subpixels include at least a first subpixel and a second subpixel adjacent to the first subpixel. A first color filter and a second color filter are formed. The first color filter is physically separated from the second color filter. An inorganic layer is formed on the first color filter and the second color filter, and in an area between the first color filter and the second color filter. A black matrix layer is formed on the inorganic layer in at least the area between the first color filter and the second color filter. The black matrix layer is etched to expose at least a portion of the protective layer on the first color filter and the second color filter.

Embodiments also relate to a method of manufacturing a display device. An array of subpixels is formed on a first surface of a first substrate. The array of subpixels includes at least a first subpixel, a second subpixel, and a third subpixel adjacent to the first subpixel and the second subpixel. A first color filter and a second color filter are formed. The first color filter is physically separated from the second color filter. A protective layer is formed on the first color filter and the second color filter, and in an area between the first color filter and the second color filter. A third color filter layer is formed in at least the area between the first color filter and the second color filter on the protective layer. The third color filter layer is etched to expose at least a portion of the protective layer on the first color filter and the second color filter. The etched third color filter layer forms a third color filter physically separated from the first color filter and the second color filter by the protective layer.

In one embodiment, a part of the protective layer in the space between the first color filter and the second color filter is etched after forming the protective layer. Another part of the protective layer on the first color filter and the second color filter is etched to expose at least a portion of the first color filter and the second color filter after etching the third color filter layer. The etched protective layer form a first part disposed between the first color filter and the third color filter and below at least a portion of the third color filter, and a second part disposed between the second color filter and the third color filter and below at least another portion of the third color filter.

It is to be understood that both the foregoing general description and the following detailed description of the present invention are exemplary and explanatory and are intended to provide further explanation of the invention as claimed.

BRIEF DESCRIPTION OF THE DRAWINGS

The accompanying drawings, which are included to provide a further understanding of the invention and are incorporated in and constitute a part of this application, illustrate embodiments of the invention and together with the description serve to explain the principle of the invention. In the drawings:

FIGS. 7A to 7G are cross-sectional views taken along line I-I' for describing a method of manufacturing a display device according to an embodiment of the present disclosure.

FIGS. 18A to 18H are cross-sectional views taken along line II-II' for describing a method of manufacturing a display device according to another embodiment of the present disclosure.

DETAILED DESCRIPTION OF THE DISCLOSURE

Figure 1A:
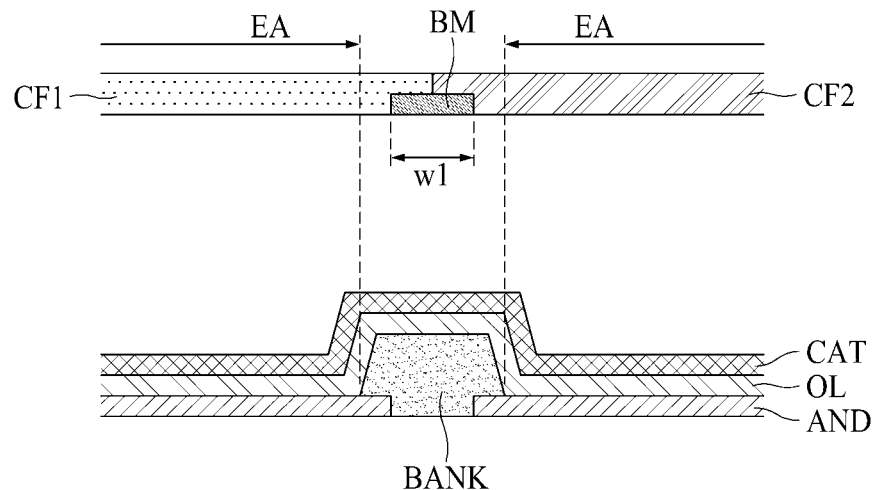
FIGS. 1A to 1C are exemplary diagrams illustrating in detail a reduction in an aperture ratio and occurrence of color mixing caused by a design error of a black matrix, a color filter, and a bank.
Figure 1B:
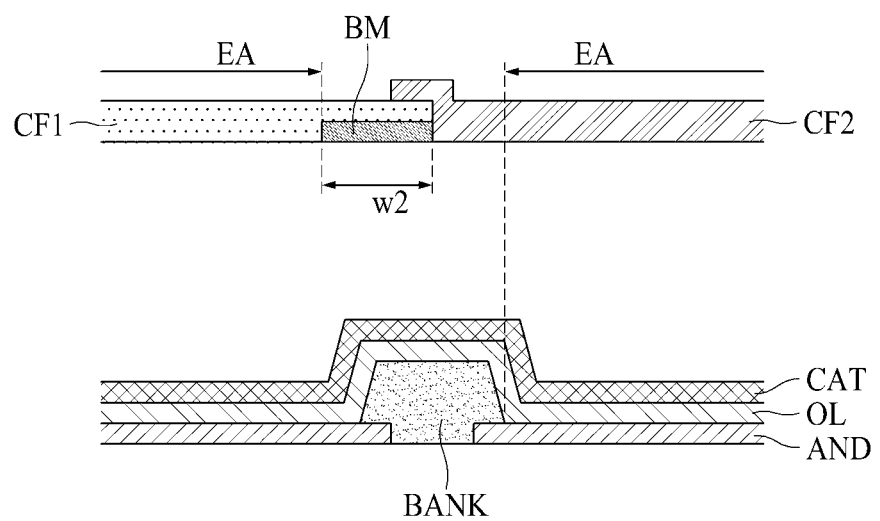
Figure 1C:
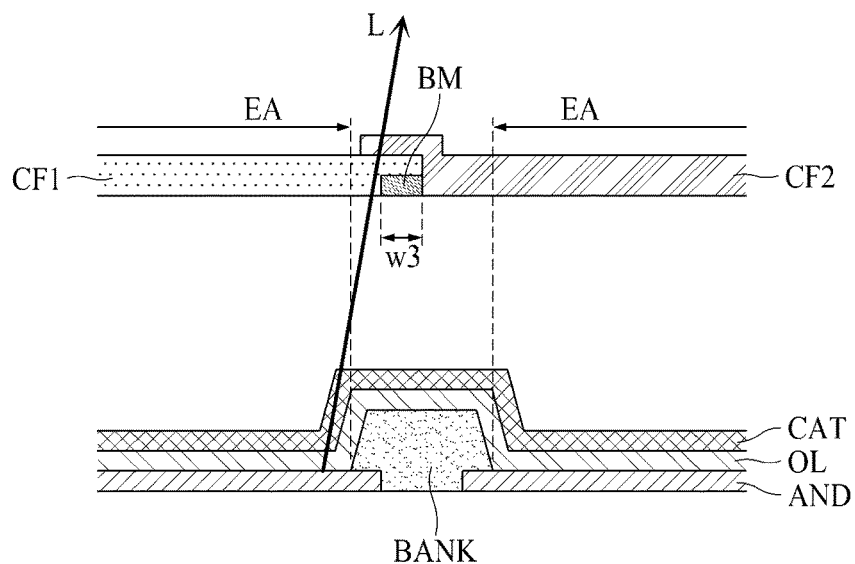

Reference will now be made in detail to the exemplary embodiments of the present disclosure, examples of which are illustrated in the accompanying drawings. Wherever possible, the same reference numbers will be used throughout the drawings to refer to the same or like parts.

Advantages and features of the present disclosure, and implementation methods thereof will be clarified through following embodiments described with reference to the accompanying drawings. The present disclosure may, however, be embodied in different forms and should not be construed as limited to the embodiments set forth herein. Rather, these embodiments are provided so that this disclosure will be thorough and complete, and will fully convey the scope of the present disclosure to those skilled in the art. Further, the present disclosure is only defined by scopes of claims.

A shape, a size, a ratio, an angle, and a number disclosed in the drawings for describing embodiments of the present disclosure are merely an example, and thus, the present disclosure is not limited to the illustrated details. Like reference numerals refer to like elements throughout. In the following description, when the detailed description of the relevant known function or configuration is determined to unnecessarily obscure the important point of the present disclosure, the detailed description will be omitted.

In a case where 'comprise', 'have', and 'include' described in the present specification are used, another part may be added unless 'only~' is used. The terms of a singular form may include plural forms unless referred to the contrary.

In construing an element, the element is construed as including an error range although there is no explicit description.

In describing a position relationship, for example, when a position relation between two parts is described as 'on~', 'over~', 'under~', and 'next~', one or more other parts may be disposed between the two parts unless 'just' or 'direct' is used.

In describing a time relationship, for example, when the temporal order is described as 'after~', 'subsequent~', 'next~', and 'before~', a case which is not continuous may be included unless 'just' or 'direct' is used.

It will be understood that, although the terms "first", "second", etc. may be used herein to describe various elements, these elements should not be limited by these terms. These terms are only used to distinguish one element from another. For example, a first element could be termed a second element, and, similarly, a second element could be termed a first element, without departing from the scope of the present disclosure.

An X axis direction, a Y axis direction, and a Z axis direction should not be construed as only a geometric relationship where a relationship therebetween is vertical, and may denote having a broader directionality within a scope where elements of the present disclosure operate functionally.

The term "at least one" should be understood as including any and all combinations of one or more of the associated listed items. For example, the meaning of "at least one of a first item, a second item, and a third item" denotes the combination of all items proposed from two or more of the first item, the second item, and the third item as well as the first item, the second item, or the third item.

Features of various embodiments of the present disclosure may be partially or overall coupled to or combined with each other, and may be variously inter-operated with each other and driven technically as those skilled in the art can sufficiently understand. The embodiments of the present disclosure may be carried out independently from each other, or may be carried out together in co-dependent relationship.

Hereinafter, exemplary embodiments of the present disclosure will be described in detail with reference to the accompanying drawings.

Figure 2:
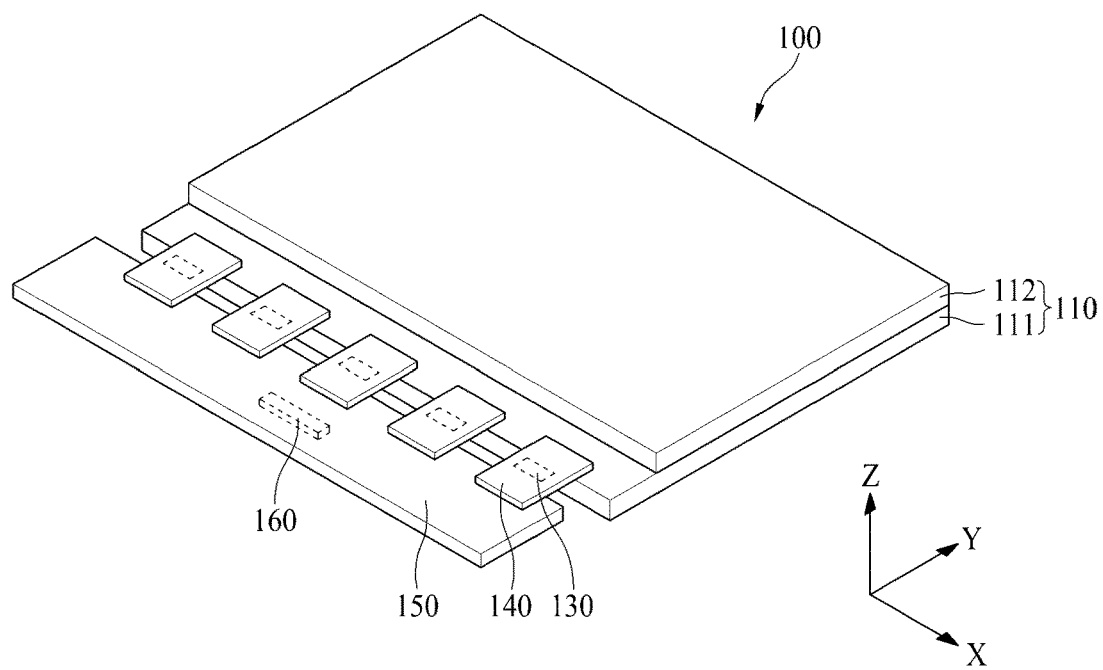
FIG. 2 is a perspective view illustrating a display device according to an embodiment of the present disclosure.
Figure 3:
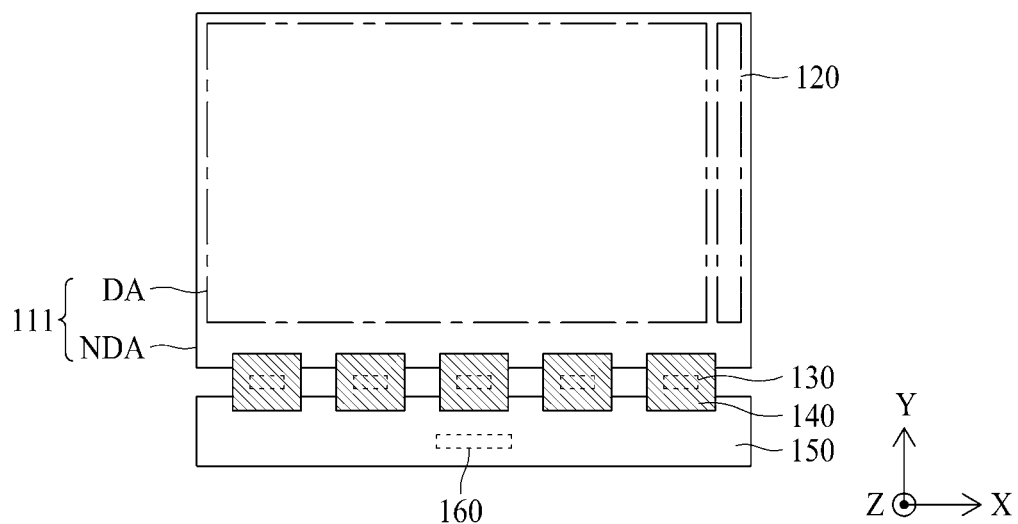
FIG. 3 is a plan view illustrating a first substrate, a gate driver, a source drive integrated circuit (IC), a flexible film, a circuit board, and a timing controller of FIG. 2 according to an embodiment of the present disclosure.

FIG. 2 is a perspective view illustrating a display device 100 according to an embodiment of the present disclosure. FIG. 3 is a plan view illustrating a first substrate, a gate driver, a source drive integrated circuit (IC), a flexible film, a circuit board, and a timing controller of FIG. 2 according to an embodiment of the present disclosure. Hereinafter, an example where the display device 100 according to an embodiment of the present disclosure is an organic light emitting display device will be described, but the present embodiment is not limited to organic light emitting display devices. In other embodiments, the display device 100 according to an embodiment of the present disclosure may be implemented as one of an LCD device, a field emission display device, an electrophoresis display device, etc.

Referring to FIGS. 2 and 3, the display device 100 according to an embodiment of the present disclosure may include a display panel 110, a gate driver 120, a source drive IC 130, a flexible film 140, a circuit board 150, and a timing controller 160.

The display panel 110 may include a first substrate 111 and a second substrate 112. The second substrate 112 may be an encapsulation substrate. The first substrate 111 may be a plastic film or a glass substrate. The second substrate 112 may be a plastic film, a glass substrate, or an encapsulation film.

A plurality of gate lines, a plurality of data lines, and a plurality of pixels may be provided on one surface of the first substrate 111 facing the second substrate 112. The pixels may be respectively provided in a plurality of areas defined by an intersection structure of the gate lines and the data lines.

Each of the pixels may include a thin film transistor (TFT) and an organic light emitting device which includes a first electrode, an organic light emitting layer, and a second electrode. Each of the pixels may supply a certain current to the organic light emitting device according to a data voltage of a data line when a gate signal is input through a gate line by using the TFT. Therefore, the organic light emitting device of each of the pixels may emit light having certain brightness according to the amount of current. A structure of each of the pixels will be described below in detail with reference to FIGS. 4, 5, 8, 9, 11, 12, 15, and 16.

The display panel 110, as illustrated in FIG. 3, may include a display area DA which displays an image and a non-display area NDA which does not display an image. The data lines, the gate lines, and the pixels may be provided in the display area DA. The gate driver 120 and a plurality of pads may be provided in the non-display area NDA.

The gate driver 120 may sequentially supply gate signals to the gate lines according to a gate control signal input from the timing controller 160. The gate driver 120 may be provided in the non-display area NDA outside one side or each of both sides of the display area DA of the display panel 110 in a gate driver in panel (GIP) type. Alternatively, the gate driver 120 may be manufactured as a driving chip, mounted on a flexible film, and attached on the non-display area NDA outside the one side or each of the both sides of the display area DA of the display panel 110 in a tape automated bonding (TAB) type.

The source drive IC 130 may receive digital video data and a source control signal from the timing controller 160. The source drive IC 130 may convert the digital video data into analog data voltages according to the source control signal and may respectively supply the analog data voltages to the data lines. In a case where the source drive IC 130 is manufactured as a driving chip, the source drive IC 130 may be mounted on the flexible film 140 in a chip-on film (COF) type or a chip-on plastic (COP) type.

A plurality of pads such as data pads may be provided in the non-display area NDA of the display panel 110. A plurality of lines connecting the pads to the source drive IC 130 and a plurality of lines connecting the pads to lines of the circuit board 150 may be provided in the flexible film 140. The flexible film 140 may be attached on the pads by using an anisotropic conductive film, and thus, the pads may be connected to the lines of the flexible film 140.

The flexible film 140 may be provided in plurality, and the circuit board 150 may be attached on the plurality of flexible films 140. A plurality of circuits which are respectively implemented as a plurality of driving chips may be mounted on the circuit board 150. For example, the timing controller 160 may be mounted on the circuit board 150. The circuit board 150 may be a printed circuit board (PCB) or a flexible printed circuit board (FPCB).

The timing controller 160 may receive the digital video data and a timing signal from an external system board (not shown) through a cable of the circuit board 150. The timing controller 160 may generate the gate control signal for controlling an operation timing of the gate driver 120 and a source control signal for controlling a plurality of the source drive ICs 130, based on the timing signal. The timing controller 160 may supply the gate control signal to the gate driver 120 and may supply the source control signal to the source drive ICs 130.

Figure 4:
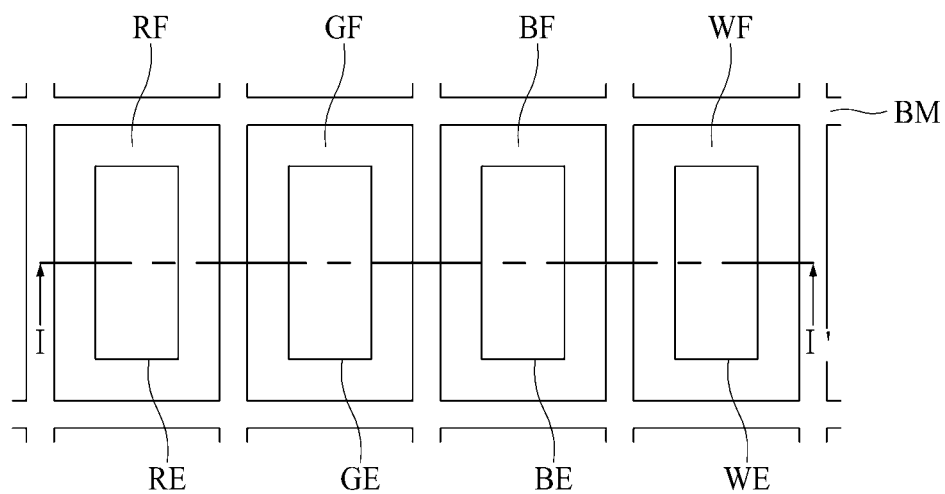
FIG. 4 is a plan view illustrating an example of pixels in a display area according to an embodiment of the present disclosure.

FIG. 4 is a plan view illustrating an example of pixels in a display area according to an embodiment of the present disclosure. The display area includes an array of subpixels that emit light. In FIG. 4, for convenience of description, only a plurality of emissive areas RE, GE, BE, and WE, a plurality of color filters RF, GF, and BF, a transparent organic layer WF, and a black matrix BM provided in pixels are illustrated.

Referring to FIG. 4, each of the emissive areas RE, GE, BE, and WE may be an area where a first electrode corresponding to an anode electrode, an organic light emitting layer, and a second electrode corresponding to a cathode electrode are sequentially stacked, and thus, a hole from the first electrode and an electron from the second electrode are combined in the organic light emitting layer to emit light.

The organic light emitting layer of the emissive areas RE, GE, BE, and WE is formed as a common layer in the emissive areas RE, GE, BE, and WE. A first color filter RF may be disposed in correspondence with a red emissive area RE, a second color filter GF may be disposed in correspondence with a green emissive area GE, and a third color filter BF may be disposed in correspondence with a blue emissive area BE. Also, the transparent organic layer WF may be disposed in correspondence with a white emissive area WE. Therefore, the red emissive area RE may emit red light by using the first color filter RF, the green emissive area GE may emit green light by using the second color filter GF, and the blue emissive area BE may emit blue light by using the third color filter BF. Also, the white emissive area WE may overlap the transparent organic layer WF without a color filter, and thus, may emit white light.

In FIG. 4, a red subpixel including the red emissive area RE, a green subpixel including the green emissive area GE, a blue subpixel including the blue emissive area BE, and a white subpixel including the white emissive area WE may be defined as one unit pixel. However, the present embodiment is not limited thereto, and the white subpixel may be omitted. In this case, the red subpixel, the green subpixel, and the blue subpixel may be defined as one unit pixel.

The black matrix BM may divide the color filters RF, GF, and BF and the transparent organic layer WF. To this end, the black matrix BM may be disposed between the color filters RF, GF, and BF and the transparent organic layer WF.

Figure 5:
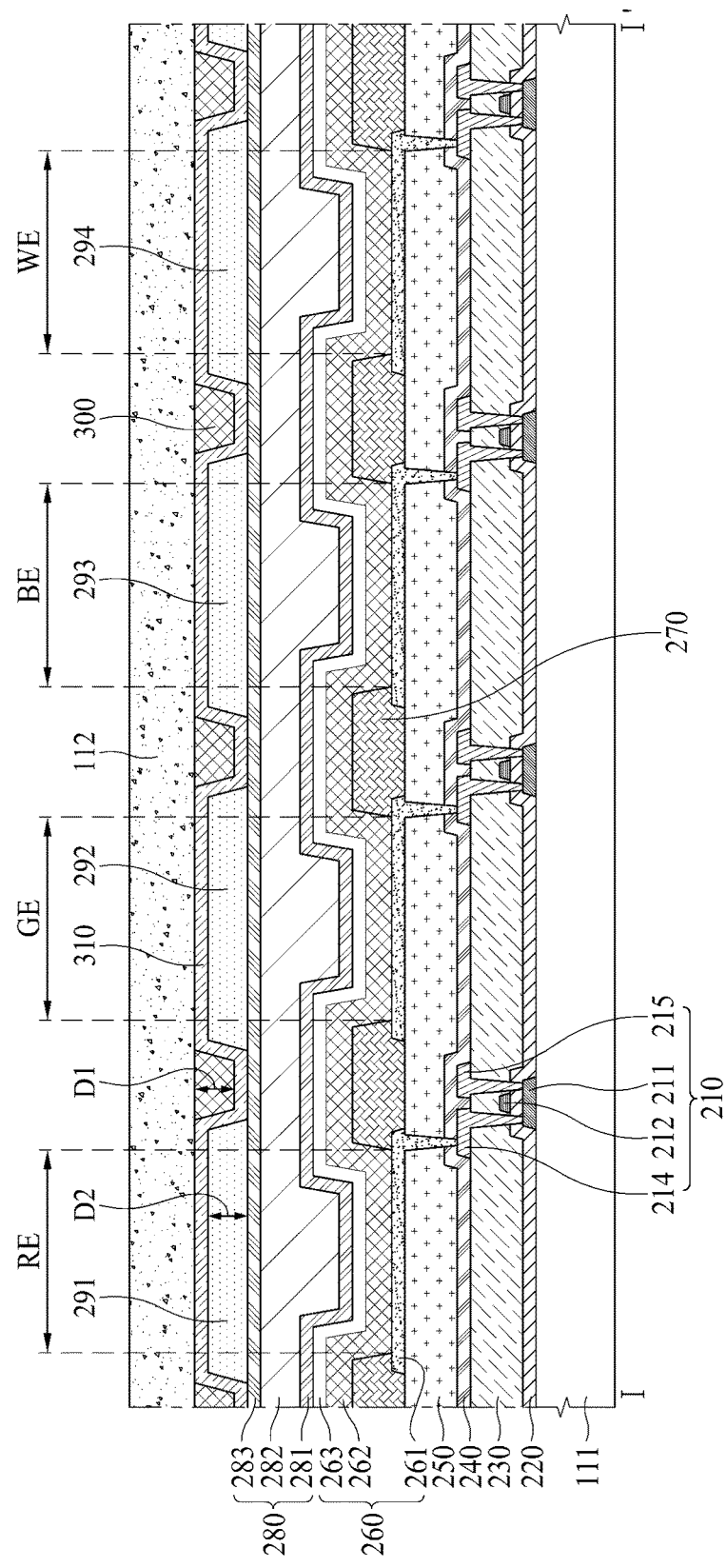
FIG. 5 is a cross-sectional view taken along line I-I' of FIG. 4 according to an embodiment of the present disclosure.

FIG. 5 is a cross-sectional view taken along line I-I' of FIG. 4 for example.

Referring to FIG. 5, a buffer layer may be formed on one surface of the first substrate 111 facing the second substrate 112. The buffer layer may be formed on the one surface of the first substrate 111, for protecting a plurality of TFTs 210 and a plurality of organic light emitting devices 260 from water which penetrates through the first substrate 111 vulnerable to penetration of water. The buffer layer may include a plurality of inorganic layers which are alternately stacked. For example, the buffer layer may be formed of a multilayer where one or more inorganic layers of silicon oxide (SiOx), silicon nitride (SiNx), and SiON are alternately stacked. The buffer layer may be omitted.

The TFTs 210 may be formed on the buffer layer. Each of the TFTs 210 may include an active layer 211, a gate electrode 212, a source electrode 215, and a drain electrode 214. In FIG. 5, the TFTs 210 are exemplarily illustrated as being formed in a top gate type where the gate electrode 212 is disposed on the active layer 211, but is not limited thereto. That is, the TFTs 210 may be formed in a bottom gate type where the gate electrode 212 is disposed under the active layer 211 or a double gate type where the gate electrode 212 is disposed both on and under the active layer 211.

The active layer 211 may be formed on the buffer layer. The active layer 211 may be formed of a silicon-based semiconductor material or an oxide-based semiconductor material. A light blocking layer for blocking external light incident on the active layer 211 may be formed between the buffer layer and the active layer 211.

A gate insulation layer 220 may be formed on the active layer 211. The gate insulation layer 220 may be formed of an inorganic layer, and for example, may be formed of silicon oxide (SiOx), silicon nitride (SiNx), or a multilayer thereof.

The gate electrode 212 and a gate line may be formed on the gate insulation layer 220. The gate electrode 212 and the gate line may each be formed of a single layer or a multilayer which includes one of molybdenum (Mo), aluminum (Al), chromium (Cr), gold (Au), titanium (Ti), nickel (Ni), neodymium (Nd), and copper (Cu), or an alloy thereof.

An interlayer insulation layer 230 may be formed of the gate electrode 212 and the gate line. The interlayer insulation layer 230 may be formed of an inorganic layer, and for example, may be formed of SiOx, SiNx, or a multilayer thereof.

The source electrode 215, the drain electrode 214, and a data line may be formed on the interlayer insulation layer 230. Each of the source electrode 215 and the drain electrode 214 may contact the active layer 211 through a contact hole which passes through the gate insulation layer 220 and the interlayer insulation layer 230. The source electrode 215, the drain electrode 214, and the data line may each be formed of a single layer or a multilayer which includes one of Mo, Al, Cr, Au, Ti, Ni, Nd, and Cu, or an alloy thereof.

A passivation layer 240 for insulating the TFTs 210 may be formed on the source electrode 215, the drain electrode 214, and the data line. The passivation layer 240 may be formed of an inorganic layer, and for example, may be formed of SiOx, SiNx, or a multilayer thereof.

A planarization layer 250 for planarizing a step height caused by the TFTs 210 may be formed on the passivation layer 240. The planarization layer 250 may be formed of an organic layer such as acryl resin, epoxy resin, phenolic resin, polyamide resin, polyimide resin, and/or the like.

An organic light emitting device 260 and a bank 270 may be formed on the planarization layer 250. The organic light emitting device 260 may include a first electrode 261, an organic light emitting layer 262, and a second electrode 263. The first electrode 261 may be an anode electrode, and the second electrode 263 may be a cathode electrode.

The first electrode 261 may be formed on the planarization layer 250. The first electrode 261 may be connected to the drain electrode 214 of the TFT 210 through a contact hole which passes through the passivation layer 240 and the planarization layer 250. The first electrode 261 may be a metal material, which is high in reflectivity, such as a stacked structure (Ti/Al/Ti) of Al and Ti, a stacked structure (ITO/Al/ITO) of Al and ITO, an APC alloy, or a stacked structure (ITO/APC/ITO) of an APC alloy and ITO. The APC alloy may be an alloy of Ag, palladium (Pd), and Cu.

The bank 270 may be formed on the planarization layer 250 to cover an edge of the first electrode 261, for defining the emissive areas RE, GE, BE, and WE. That is, the boundaries of the bank 270 may define the emissive areas.

Also, an area where the bank 270 is formed cannot emit light, and thus, may be defined as a non-emissive area. The bank 270 may be formed of an organic layer such as acryl resin, epoxy resin, phenolic resin, polyamide resin, polyimide resin, and/or the like.

The organic light emitting layer 262 may be formed on the first electrode 261 and the bank 270. The organic light emitting layer 262 may be a common layer which is formed in the emissive areas RE, GE, BE, and WE in common, and may be a white light emitting layer which emits white light. In this case, the organic light emitting layer 262 may be formed in a tandem structure of two or more stacks. Each of the stacks may include a hole transporting layer, at least one light emitting layer, and an electron transporting layer.

Moreover, a charge generating layer may be formed between the stacks. The charge generating layer may include an n-type charge generating layer, disposed adjacent to a lower stack, and a p-type charge generating layer which is formed on the n-type charge generating layer and is disposed adjacent to an upper stack. The n-type charge generating layer may inject an electron into the lower stack, and the p-type charge generating layer may inject a hole into the upper stack. The n-type charge generating layer may be formed of an organic layer which is doped with alkali metal, such as lithium (Li), sodium (Na), potassium (K), or cesium (Cs), or alkali earth metal such as magnesium (Mg), strontium (Sr), barium (Ba), or radium (Ra). The p-type charge generating layer may be formed by doping a dopant on an organic material having an ability to transport holes.

The second electrode 263 may be formed on the organic light emitting layer 262. The second electrode 263 may be a common layer which is formed in the emissive areas RE, GE, BE, and WE in common. The second electrode 263 may be formed of a transparent conductive material (or TCO), such as indium tin oxide (ITO) or indium zinc oxide (IZO) capable of transmitting light, or a semi-transmissive conductive material such as Mg, Ag, or an alloy of Mg and Ag. A capping layer may be formed on the second electrode 263.

An encapsulation layer 280 may be formed on the second electrode 263. The encapsulation layer 280 prevents oxygen or water from penetrating into the organic light emitting layer 262 and the second electrode 263. To this end, the encapsulation layer 280 may include at least one inorganic layer and at least one organic layer.

For example, the encapsulation layer 280 may include a first inorganic layer 281, an organic layer 282, and a second inorganic layer 283. In this case, the first inorganic layer 281 may be formed to cover the second electrode 263. The organic layer 282 may be formed to cover the first inorganic layer 281. The organic layer 282 may be formed to a sufficient thickness, for preventing particles from penetrating into the organic light emitting layer 262 and the second electrode 263 via the first inorganic layer 281. The second inorganic layer 283 may be formed to cover the organic layer 282.

Each of the first and second inorganic layers 281 and 283 may be formed of silicon nitride, aluminum nitride, zirconium nitride, titanium nitride, hafnium nitride, tantalum nitride, silicon oxide, aluminum oxide, titanium oxide, and/or the like. The organic layer 282 may be formed of acryl resin, epoxy resin, phenolic resin, polyamide resin, polyimide resin, and/or the like.

First to third color filters 291, 292, 293 and a transparent organic layer 294 may be formed on the encapsulation layer 290. The color filters 291, 292, 293 may be physically separated from each other. In a case where the first to third color filters 291 to 293 are directly formed on the encapsulation layer 280, when bonding the first substrate 111 to the second substrate 112, it is not required to align the first to third color filters 291 to 293, and a separate adhesive layer is not needed. The first to third color filters 291 to 293 may be spaced apart from the transparent organic layer 294 by a certain interval.

In FIG. 5, the first color filter 291 may be a red color filter disposed in correspondence with the red emissive area RE, the second color filter 292 may be a green color filter disposed in correspondence with the green emissive area GE, and the third color filter 293 may be a blue color filter disposed in correspondence with the blue emissive area BE. The transparent organic layer 294 may be disposed in correspondence with the white emissive area WE.

The first color filter 291 may be formed of an organic layer including a red pigment, the second color filter 292 may be formed of an organic layer including a green pigment, and the third color filter 293 may be formed of an organic layer including a blue pigment. The transparent organic layer 294 may be formed of acryl resin, epoxy resin, phenolic resin, polyamide resin, polyimide resin, and/or the like.

An inorganic layer 310 may be formed on the first to third color filters 291 to 293 and the transparent organic layer 294. That is, as in FIG. 5, the inorganic layer 310 may be formed to cover the first to third color filters 291 to 293, the transparent organic layer 294, and in a space between the first to third color filters 291 to 293 and the transparent organic layer 294. In some embodiments, the inorganic layer 310 may cover an entire top surface of the first color filter 291, the second color filter 292, and the third color filter 293, and may be disposed below an entire bottom surface of the black matrix 300. The inorganic layer 310 may be formed of a transparent conductive material (or TCO), such as ITO or IZO, or may be formed of SiOx, SiNx, SiON, $Al_2O_3$, or a multilayer thereof.

A black matrix 300 may be formed on the inorganic layer 310 and between the first to third color filters 291 to 293 and the transparent organic layer 294. The black matrix 300 may be formed of an organic layer including a black pigment.

The black matrix 300 may be filled between the first to third color filters 291 to 293 and the transparent organic layer 294. Since the black matrix 300 is formed through dry etching, a thickness D1 of the black matrix 300 may be thinner than a thickness D2 of each of the first to third color filters 291 to 293. The black matrix 300 may be formed in a non-emissive area instead of an emissive area, and thus, may be disposed to overlap the bank 270.

As described above, since the black matrix 300 is formed between the first to third color filters 291 to 293 and the transparent organic layer 294, a process error of the black matrix 300 is determined based on a process error of the first to third color filters 291 to 293 and the transparent organic layer 294. That is, in the related art, a process error of a black matrix and a process error of a color filter are all considered when forming the black matrix and the color filter. However, in an embodiment of the present disclosure, a position at which the black matrix is formed is determined based on the position of the color filters, and thus, only the process error of the color filter is considered.

Moreover, in an embodiment of the present disclosure, since the black matrix 300 is formed between the first to third color filters 291 to 293 and the transparent organic layer 294, a possibility that the black matrix 300 is formed to overlap the emissive areas RE, GE, BE, and WE is small. Accordingly, in an embodiment of the present disclosure, an aperture ratio of an emissive area is prevented from being reduced due to a process error of each of a black matrix and a color filter.

Moreover, in an embodiment of the present disclosure, a space into which the black matrix 300 is to be filled is needed between the first to third color filters 291 to 293, and thus, a possibility that the first to third color filters 291 to 293 are formed to overlap each other is small. Accordingly, in an embodiment of the present disclosure, color mixing is prevented from occurring due to a process error of each of a black matrix and a color filter.

Furthermore, in an embodiment of the present disclosure, since the black matrix 300 is formed between the first to third color filters 291 to 293 and the transparent organic layer 294, the black matrix 300 may be formed to have a planar surface disposed on the same layer as a planar surface of the inorganic layer 310 on the first to third color filters 291 to 293 and the transparent organic layer 294. In other words, the top surface of the black matrix BM may be level with a top surface of the inorganic layer 310 disposed on the first color filter 291 and the third color filter 293. Accordingly, in an embodiment of the present disclosure, an overcoat layer for planarizing step heights of the color filters may not be formed on the black matrix 300 and the inorganic layer 310.

The second substrate 112 may be attached on the first and third color filters 291 and 293 and the inorganic layer 310. The second substrate 112 may be an encapsulation film.

Figure 6:
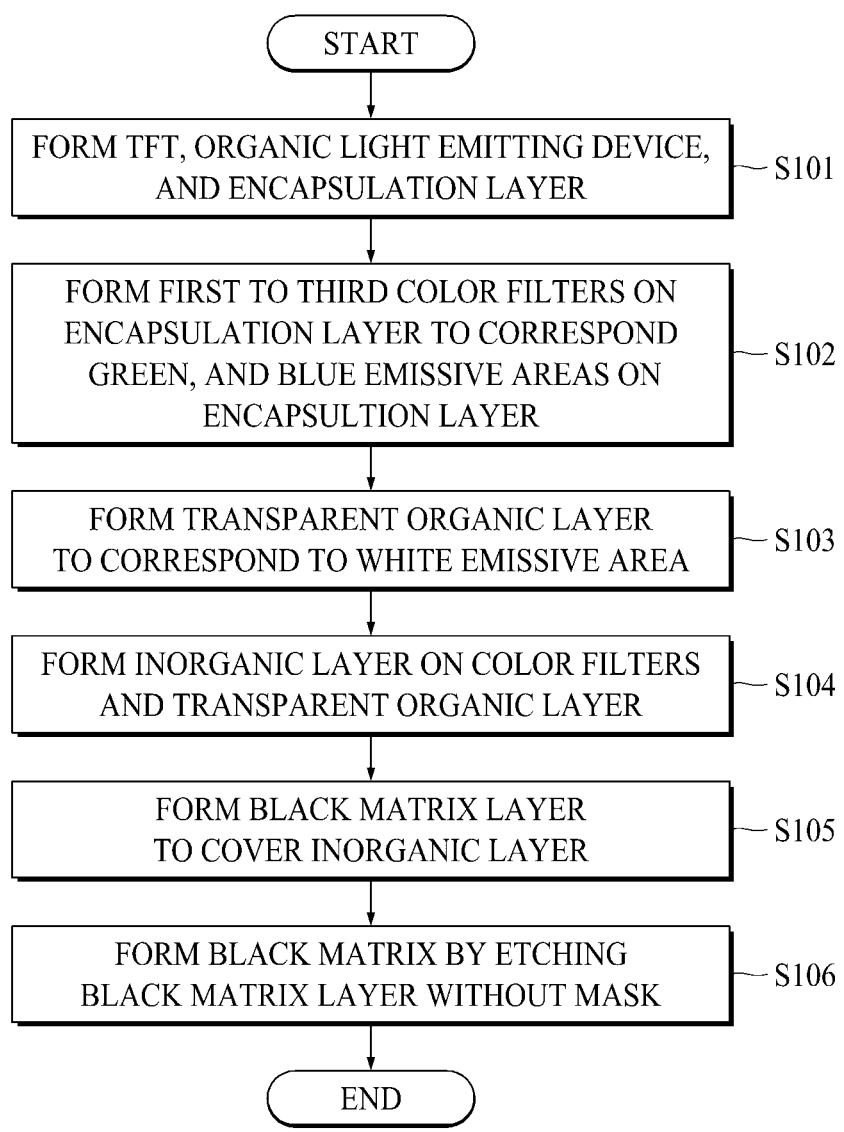
FIG. 6 is a flowchart illustrating a method of manufacturing a display device according to an embodiment of the present disclosure.

FIG. 6 is a flowchart illustrating a method of manufacturing a display device according to an embodiment of the present disclosure. FIGS. 7A to 7G are cross-sectional views taken along line I-I' for describing a method of manufacturing a display device according to an embodiment of the present invention.

The cross-sectional views illustrated in FIGS. 7A to 7G relate to the method of manufacturing the display device illustrated in FIG. 6, and thus, like reference numerals refer to like elements. Hereinafter, a method of manufacturing a display device according to an embodiment of the present disclosure will be described in detail with reference to FIGS. 6 and 7A to 7G.

Figure 7A:
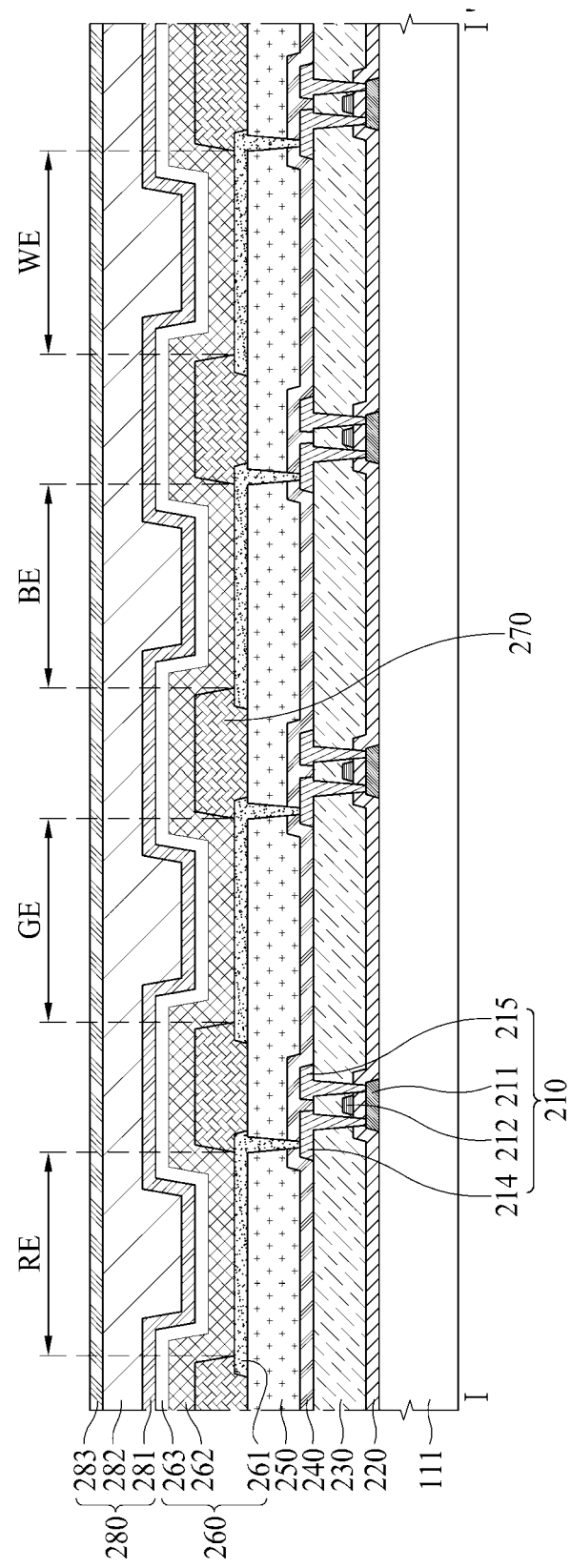

First, as illustrated in FIG. 7A, a TFT 210, an organic light emitting device 260, and an encapsulation layer 280 may be formed.

In detail, before forming the TFT 210, a buffer layer for protecting the TFT 210 and the organic light emitting device 260 from water penetrating through a substrate may be formed on a first substrate 111. The buffer layer is for protecting the TFT 210 and the organic light emitting device 260 from water penetrating through the first substrate 111 vulnerable to penetration of water and may be formed of a plurality of inorganic layers which are alternately stacked. For example, the buffer layer may be formed of a multilayer where one or more inorganic layers of SiOx, SiNx, and SiON are alternately stacked. The buffer layer may be formed by a chemical vapor deposition (CVD) process.

Subsequently, an active layer 211 included in the TFT 210 may be formed on the buffer layer. In detail, an active metal layer may be formed all over the buffer layer by using a sputtering process, a metal organic chemical vapor deposition (MOCVD) process, and/or the like. Subsequently, the active layer 211 may be formed by patterning the active metal layer through a mask process using a photoresist pattern. The active layer 211 may be formed of a silicon-based semiconductor material or an oxide-based semiconductor material.

Subsequently, a gate insulation layer 220 may be formed on the active layer 211. The gate insulation layer 220 may be formed of an inorganic layer, and for example, may be formed of SiOx, SiNx, or a multilayer thereof.

Subsequently, a gate electrode 212 included in the TFT 210 may be formed on the gate insulation layer 220. In detail, a first metal layer may be formed all over the gate insulation layer 220 by using a sputtering process, an MOCVD process, and/or the like. Subsequently, the gate electrode 212 may be formed by patterning the first metal layer through a mask process using a photoresist pattern. The gate electrode 212 may each be formed of a single layer or a multilayer which includes one of Mo, Al, Cr, Au, Ti, Ni, Nd, and Cu, or an alloy thereof.

Subsequently, an interlayer insulation layer 230 may be formed on the gate electrode 212. The interlayer insulation layer 230 may be formed of an inorganic layer, and for example, may be formed of SiOx, SiNx, or a multilayer thereof.

Subsequently, a plurality of contact holes which pass through the gate insulation layer 220 and the interlayer insulation layer 230 and expose the active layer 211 may be formed.

Subsequently, a source electrode 215 and a drain electrode 214 included in the TFT 210 may be formed on the interlayer insulation layer 230. In detail, a second metal layer may be formed all over the interlayer insulation layer 230 by using a sputtering process, an MOCVD process, and/or the like. Subsequently, the source electrode 215 and the drain electrode 214 may be formed by patterning the second metal layer through a mask process using a photoresist pattern. The source electrode 215 and the drain electrode 214 may contact the active layer 211 through the contact holes which pass through the gate insulation layer 220 and the interlayer insulation layer 230. The source electrode 215 and the drain electrode 214 may each be formed of a single layer or a multilayer which includes one of Mo, Al, Cr, Au, Ti, Ni, Nd, and Cu, or an alloy thereof.

Subsequently, a passivation layer 240 may be formed on the source electrode 215 and the drain electrode 214 of the TFT 210. The passivation layer 240 may be formed of an inorganic layer, and for example, may be formed of SiOx, SiNx, or a multilayer thereof. The passivation layer 240 may be formed by a CVD process.

Subsequently, a planarization layer 250 for planarizing a step height caused by the TFT 210 may be formed on the passivation layer 240. The passivation layer 250 may be formed of an organic layer such as acryl resin, epoxy resin, phenolic resin, polyamide resin, polyimide resin, and/or the like.

Subsequently, a first electrode 261 included in the organic light emitting device 260 may be formed on the planarization layer 250. In detail, a third metal layer may be formed all over the planarization layer 250 by using a sputtering process, an MOCVD process, and/or the like. Subsequently, the first electrode 261 may be formed by patterning the third metal layer through a mask process using a photoresist pattern. The first electrode 261 may contact the drain electrode 214 of the TFT 210 through a contact hole which passes through the passivation layer 240 and the planarization layer 250. The first electrode 261 may be a metal material, which is high in reflectivity, such as a stacked structure (Ti/Al/Ti) of Al and Ti, a stacked structure (ITO/Al/ITO) of Al and ITO, an APC alloy, or a stacked structure (ITO/APC/ITO) of an APC alloy and ITO.

Subsequently, a bank 270 may be formed on the planarization layer 250 to cover an edge of the first electrode 261, for defining the emissive areas RE, GE, BE, and WE. The bank 270 may be formed of an organic layer such as acryl resin, epoxy resin, phenolic resin, polyamide resin, polyimide resin, and/or the like.

Subsequently, an organic light emitting layer 262 may be formed on the first electrode 261 and the bank 270 through a deposition process or a solution process. The organic light emitting layer 262 may be a common layer which is formed in the emissive areas RE, GE, BE, and WE in common. In this case, the organic light emitting layer 262 may be a white light emitting layer which emits white light.

If the organic light emitting layer 262 is the white light emitting layer, the organic light emitting layer 262 may be formed in a tandem structure of two or more stacks. Each of the stacks may include a hole transporting layer, at least one light emitting layer, and an electron transporting layer.

Moreover, a charge generating layer may be formed between the stacks. The charge generating layer may include an n-type charge generating layer, disposed adjacent to a lower stack, and a p-type charge generating layer which is formed on the n-type charge generating layer and is disposed adjacent to an upper stack. The n-type charge generating layer may inject an electron into the lower stack, and the p-type charge generating layer may inject a hole into the upper stack. The n-type charge generating layer may be formed of an organic layer which is doped with alkali metal, such as lithium (Li), sodium (Na), potassium (K), or cesium (Cs), or alkali earth metal such as magnesium (Mg), strontium (Sr), barium (Ba), or radium (Ra). The p-type charge generating layer may be formed by doping a dopant on an organic material having an ability to transport holes.

Subsequently, a second electrode 263 may be formed on the organic light emitting layer 262. The second electrode 263 may be a common layer which is formed in the emissive areas RE, GE, BE, and WE in common. The second electrode 263 may be formed of a transparent conductive material (or TCO), such as ITO or IZO capable of transmitting light, or a semi-transmissive conductive material such as Mg, Ag, or an alloy of Mg and Ag. The second electrode 263 may be formed through a physical vapor deposition (PVD) process such as a sputtering process and/or the like. A capping layer may be formed on the second electrode 263.

Subsequently, an encapsulation layer 280 may be formed on the second electrode 263. The encapsulation layer 280 prevents oxygen or water from penetrating into the organic light emitting layer 262 and the second electrode 263. To this end, the encapsulation layer 280 may include at least one inorganic layer and at least one organic layer.

For example, the encapsulation layer 280 may include a first inorganic layer 281, an organic layer 282, and a second inorganic layer 283. In this case, the first inorganic layer 281 may be formed to cover the second electrode 263. The organic layer 282 may be formed to cover the first inorganic layer 281. The organic layer 282 may be formed to a sufficient thickness, for preventing particles from penetrating into the organic light emitting layer 262 and the second electrode 263 via the first inorganic layer 281. The second inorganic layer 283 may be formed to cover the organic layer 282.

Each of the first and second inorganic layers 281 and 283 may be formed of silicon nitride, aluminum nitride, zirconium nitride, titanium nitride, hafnium nitride, tantalum nitride, silicon oxide, aluminum oxide, titanium oxide, and/or the like. The organic layer 282 may be formed of acryl resin, epoxy resin, phenolic resin, polyamide resin, polyimide resin, and/or the like. (S101 of FIG. 6)

Figure 7B:
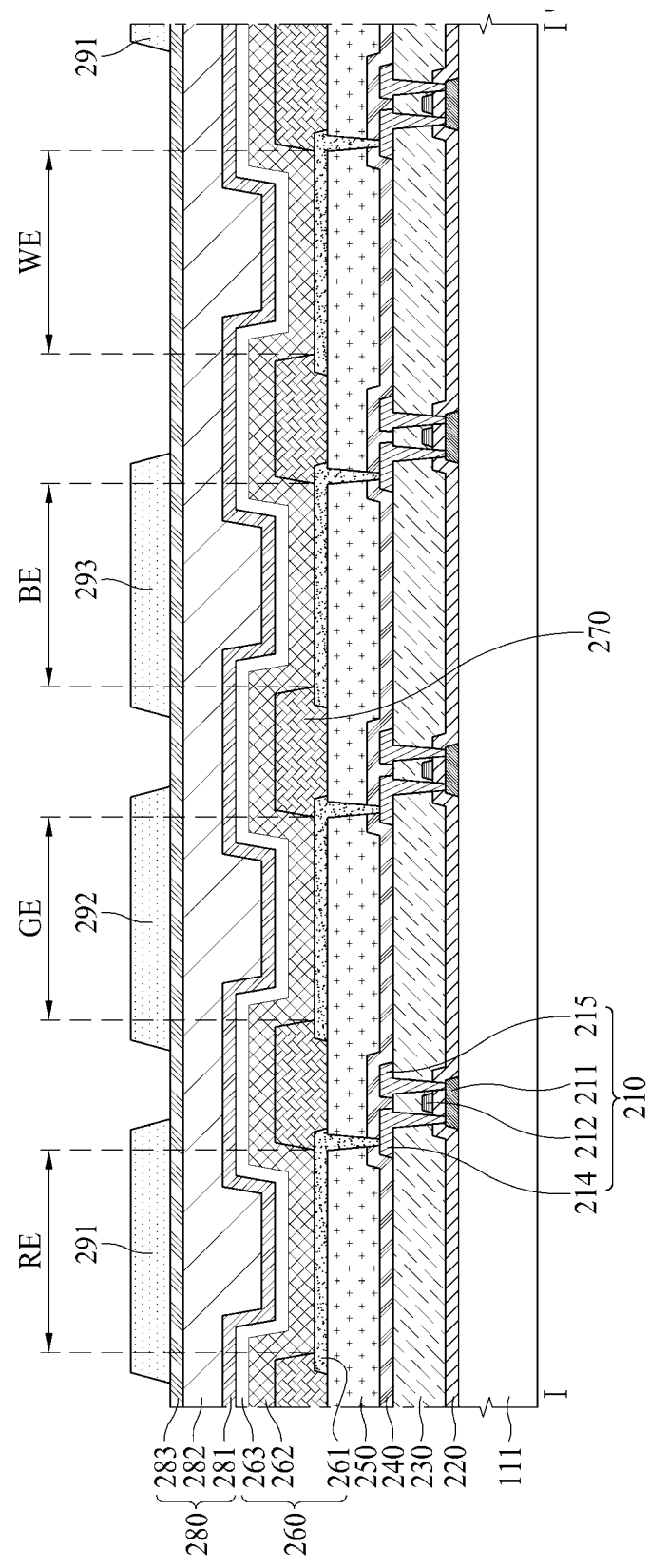

Second, as illustrated in FIG. 7B, a first color filter 291 may be formed in correspondence with the red emissive area RE, a second color filter 292 may be formed in correspondence with the green emissive area GE, and the third color filter 293 may be formed in correspondence with the blue emissive area BE. The first color filter 291 may be a red color filter, the second color filter 292 may be a green color filter, and the third color filter 293 may be a blue color filter.

In detail, an organic material including a red pigment may be coated on the encapsulation layer 280, and by performing a photo process, a first color filter 291 may be formed in the red emissive area RE. Subsequently, an organic material including a green pigment may be coated on the encapsulation layer 280, and by performing the photo process, a second color filter 292 may be formed in the green emissive area GE. Subsequently, an organic material including a blue pigment may be coated on the encapsulation layer 280, and by performing the photo process, a third color filter 293 may be formed in the blue emissive area BE.

Hereinabove, an example where the red, green, and blue color filters are formed in the order of the red, green, and blue color filters has been described. However, an order in which the color filters are formed is not limited thereto. (S102 of FIG. 6)

Third, as illustrated in FIG. 7C, a transparent organic layer 294 may be formed on the encapsulation layer 280 to correspond to the white emissive area WE.

In detail, a transparent organic material may be coated on the encapsulation layer 280, and by performing the photo process, a transparent organic layer 294 may be formed in the white emissive area WE. The transparent organic layer 294 may be formed of acryl resin, epoxy resin, phenolic resin, polyamide resin, polyimide resin, and/or the like.

If a red subpixel, a green subpixel, and a blue subpixel are defined as one unit pixel, a white subpixel may be omitted. In this case, operation S103 of forming the transparent organic layer 294 may be omitted. Also, in operations S102 and S103, the transparent organic layer 294 may be formed after the first to third color filters 291 to 293 are formed, but the present embodiment is not limited thereto. In other embodiments, the first to third color filters 291 to 293 may be formed after the transparent organic layer 294 is formed. Alternatively, some of the first to third color filters 291 to 293 may be formed, and after the transparent organic layer 294 is formed, the other color filter may be formed. For example, the first color filter 291 may be formed, and after the transparent organic layer 294 is formed, the second and third color filters 292 and 293 may be sequentially formed. (S103 of FIG. 6)

Figure 7D:
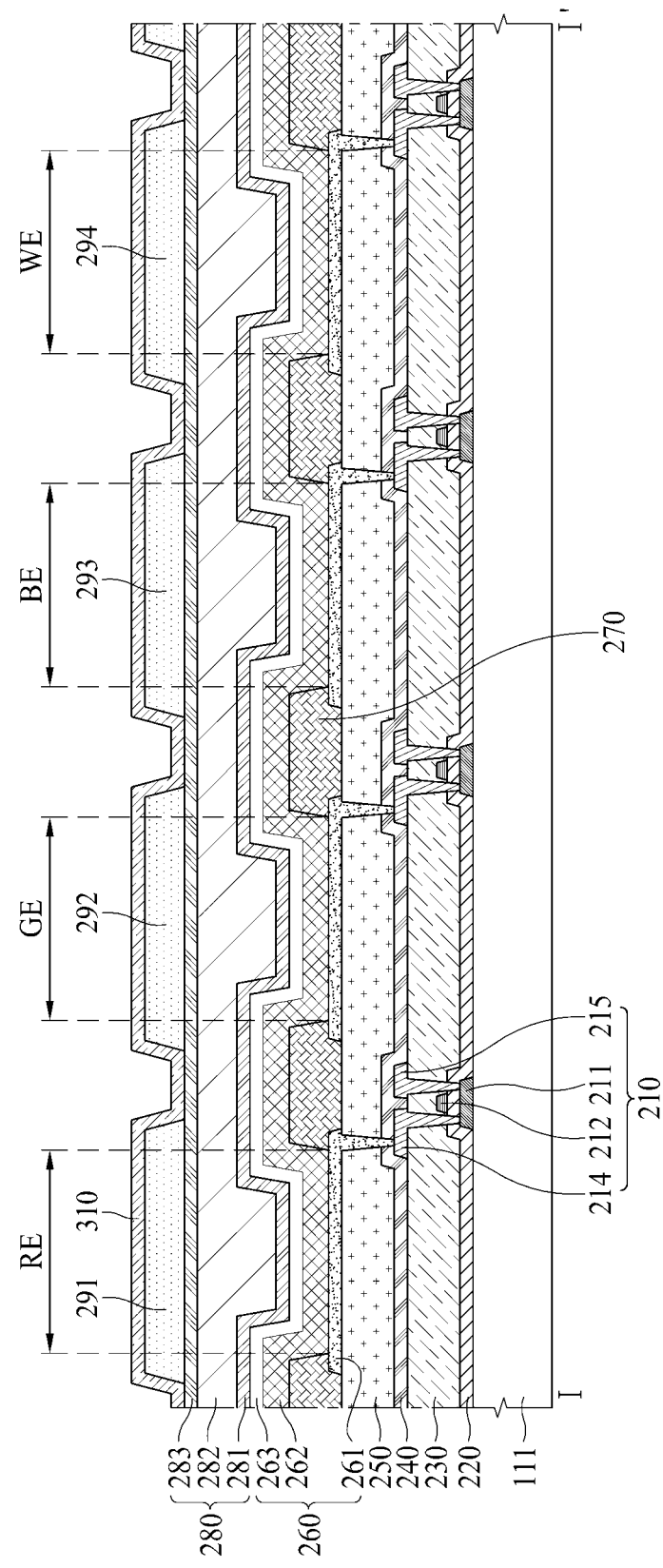

Fourth, as illustrated in FIG. 7D, an inorganic layer 310 may be formed on the first to third color filters 291 to 293 and the transparent organic layer 294.

The inorganic layer 310 may be formed to cover the first to third color filters 291 to 293, the transparent organic layer 294, and in a space between the first to third color filters 291 to 293 and the transparent organic layer 294. The inorganic layer 310 may be formed of a transparent conductive material (or TCO), such as ITO or IZO, or may be formed of SiOx, SiNx, or a multilayer thereof. If the inorganic layer 310 is formed of a transparent metal material, the inorganic layer 310 may be formed through a sputtering process. If the inorganic layer 310 is formed of SiOx, SiNx, or a multilayer thereof, the inorganic layer 310 may be formed through a CVD process. (S104 of FIG. 6)

Figure 7E:
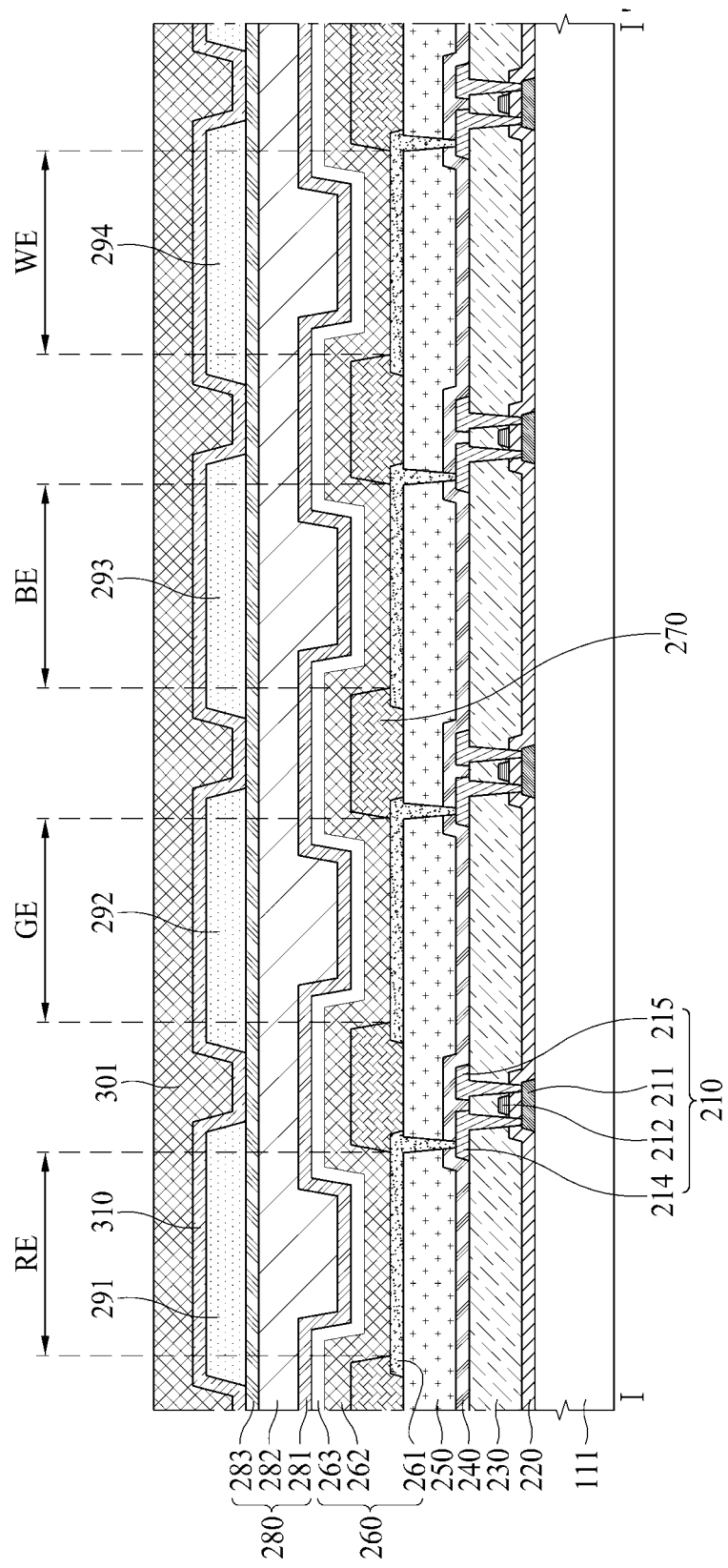

Third, as illustrated in FIG. 7E, a black matrix layer 301 may be formed to cover the inorganic layer 310. The black matrix layer 301 may be an organic material including a black pigment. (S105 of FIG. 6)

Figure 7F:
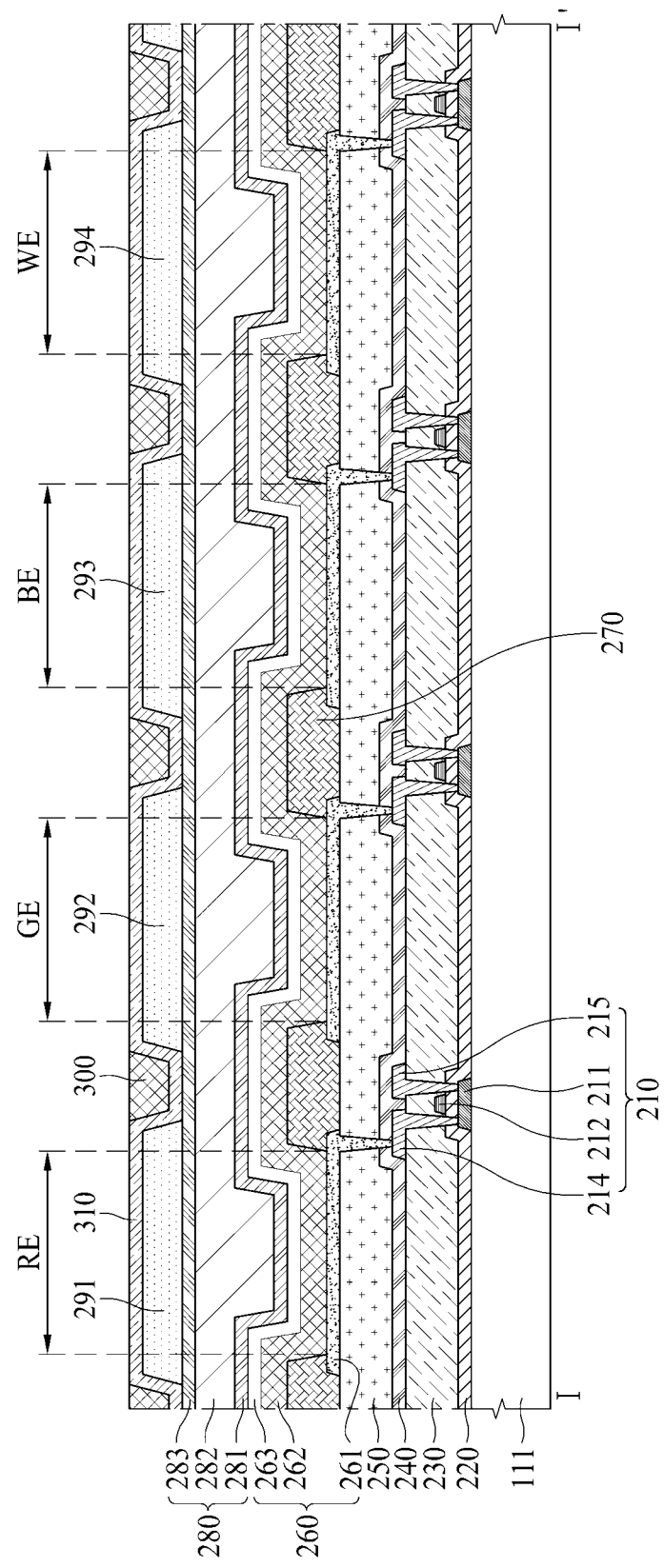

Sixth, as illustrated in FIG. 7F, a black matrix 300 may be formed by etching the black matrix layer 301 through dry etching without a mask.

A material applied to the dry etching may be a mixed gas of $O_2$ and $CF_4$. For example, a weight ratio (wt %) of $O_2$ to $CF_4$ may be 60:150, but is not limited thereto. In a case of dry-etching an organic layer and an inorganic layer by using the mixed gas of $O_2$ and $CF_4$, an etching rate of the organic layer to the inorganic layer may be 100:1 to 10:1. For example, if the inorganic layer 310 is formed of a transparent metal material (or TCO), the etching rate of the organic layer to the inorganic layer may be about 100:1. If the inorganic layer 310 is formed of SiOx, SiNx, or a multilayer thereof, the etching rate of the organic layer to the inorganic layer may be about 10:1.

Therefore, even in a case of dry-etching the black matrix layer 301 without a mask, the black matrix layer 301 corresponding to an organic material is mainly etched, and the inorganic layer 310 is hardly etched. That is, the first to third color filters 291 to 293 and the transparent organic layer 294 are protected by the inorganic layer 310 without being etched.

Moreover, by adjusting a dry etching duration, the black matrix 300 may be formed to have a planar surface disposed on the same layer as a planar surface of the inorganic layer 310 on the first to third color filters 291 to 293 and the transparent organic layer 294. If the dry etching duration is short, the black matrix 300 remains on the inorganic layer 310, and thus, lights emitted from the emissive areas RE, GE, BE, and WE are blocked by the black matrix 300. Also, if the dry etching duration is long, the black matrix 300 is thinned in thickness, and thus, a light blocking rate of the black matrix 300 is lowered. That is, the black matrix 300 cannot normally operate. An appropriate dry etching duration may be previously determined through experiments.

Moreover, the black matrix 300 is not protected by the inorganic layer 310, but the first to third color filters 291 to 293 and the transparent organic layer 294 are protected by the inorganic layer 310. Accordingly, despite adjusting the dry etching duration, a thickness D1 of the black matrix 300 is thinner than a thickness D2 of each of the first to third color filters 291 to 293.

Moreover, the black matrix 300 may be formed through dry etching without a mask, instead of a photolithography process requiring the mask, and thus, the manufacturing cost and a manufacturing time are reduced.

Moreover, since the black matrix 300 is not formed through the photolithography process, the black matrix 300 may not include a photo initiator.

Moreover, since the black matrix 300 is formed in a non-emissive area instead of an emissive area EA, the black matrix 300 may be disposed to overlap the bank 270.

Figure 7G:
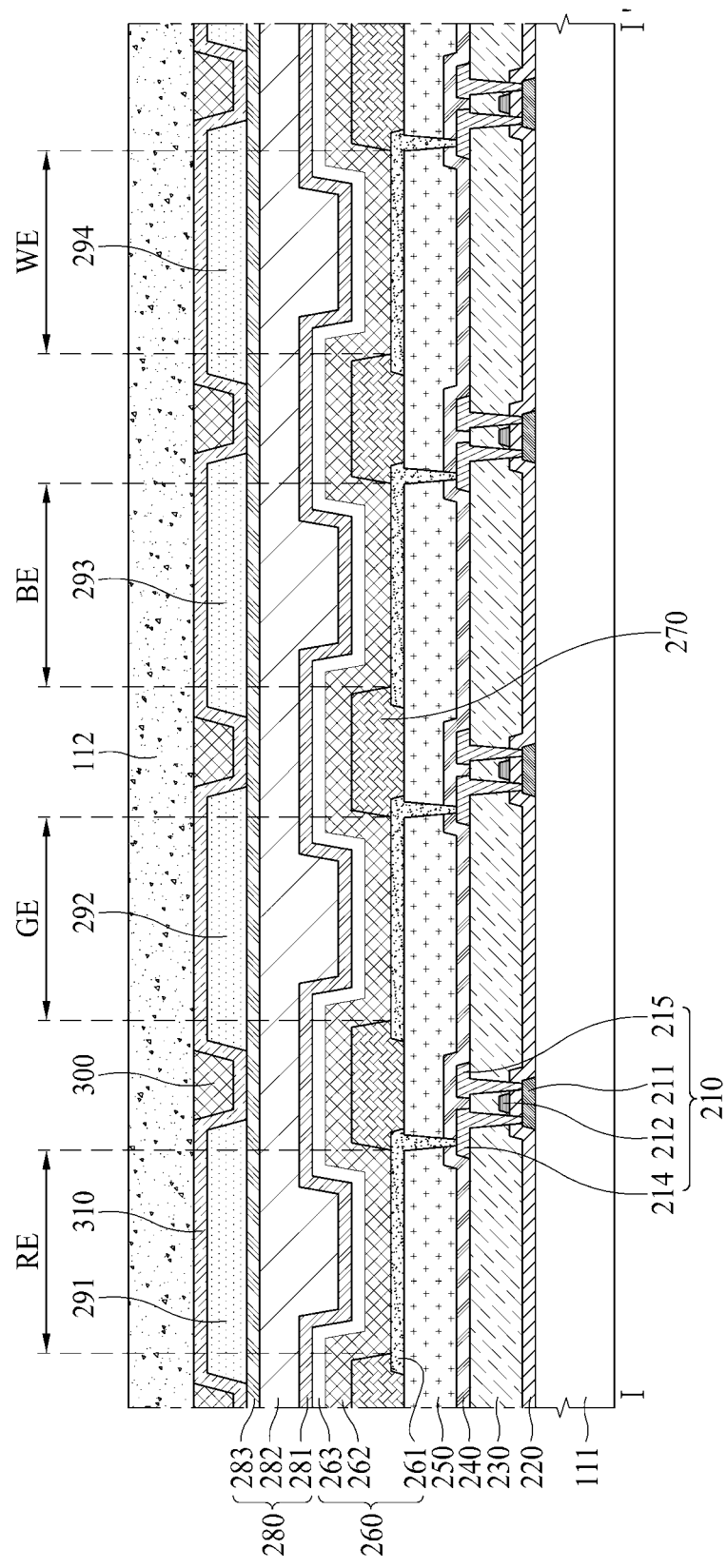

Furthermore, since the black matrix 300 fills the space between the first to third color filters 291 to 293 and the transparent organic layer 294, the black matrix 300 may be formed to have a planar surface disposed on the same layer as a planar surface of the inorganic layer 310 on the first to third color filters 291 to 293 and the transparent organic layer 294. In other words, a top surface of the black matrix BM may be level with a top surface of the first color filter 291 and the third color filter 293. Accordingly, in an embodiment of the present disclosure, as illustrated in FIG. 7G, the second substrate 112 may be attached without an overcoat layer being formed on the black matrix 300 and the inorganic layer 310. The second substrate 112 may be an encapsulation film. (S106 of FIG. 6)

A process of forming the first to third color filters 291 to 293, the transparent organic layer 294, the inorganic layer 310, and the black matrix 300 illustrated in FIGS. 7A to 7G is a process of forming the organic light emitting device 260 on the encapsulation layer 280, and thus, may be a low temperature process performed at a temperature of 100° C. or less for preventing the organic light emitting device 260 from being damaged.

In FIGS. 6 and 7A to 7G, an example where the first to third color filters 291 to 293 and the inorganic layer 310 are formed on the encapsulation layer 280 has been described. However, the first to third color filters 291 to 293 and the inorganic layer 310 may be formed on the second substrate 112 as substantially described above with reference to FIGS. 6 and 7A to 7G. In this case, a process of bonding the first substrate 111 to the second substrate 112 with an adhesive layer 320 may be further performed.

Figure 8:
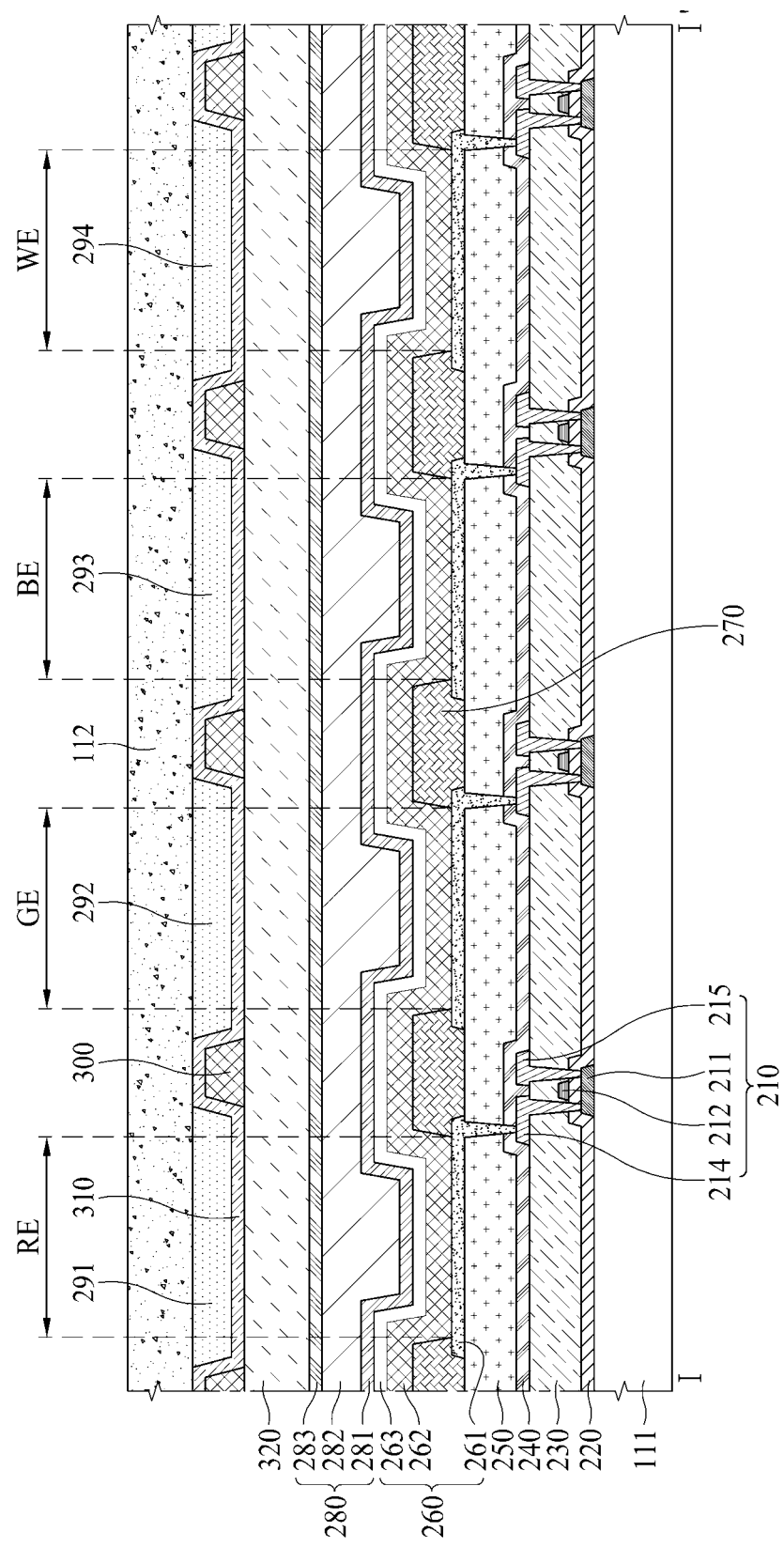
FIG. 8 is a cross-sectional view taken along line I-I' of FIG. 4 according to an embodiment of the present disclosure.

FIG. 8 is a cross-sectional view taken along line I-I' of FIG. 4 according to another embodiment of the present disclosure. The cross-sectional view of FIG. 8 is as substantially described above with reference to FIG. 5, except that first to third color filters 291 to 293, a transparent organic layer 294, a black matrix 300, and an inorganic layer 310 are formed on a second substrate 112 instead of an encapsulation layer 280, and a first substrate 111 is bonded to the second substrate 112 by an adhesive layer 320.

Moreover, in FIG. 8, the adhesive layer 320 for bonding the first substrate 111 to the second substrate 112 is needed. The adhesive layer 320 may be a transparent adhesive film or a transparent adhesive resin. Furthermore, in FIG. 8, when bonding the first substrate 111 to the second substrate 112, the first substrate 111 and the second substrate 112 may be aligned in order for the black matrix 300 to overlap a bank 270.

Moreover, a process of forming the first to third color filters 291 to 293, the transparent organic layer 294, the black matrix 300, and the inorganic layer 310 on the second substrate 112 is substantially the same as operations S102 to S106 of FIG. 6, except that the first to third color filters 291 to 293, the transparent organic layer 294, the black matrix 300, and the inorganic layer 310 are formed on the second substrate 112 instead of the encapsulation layer 280.

Figure 9:
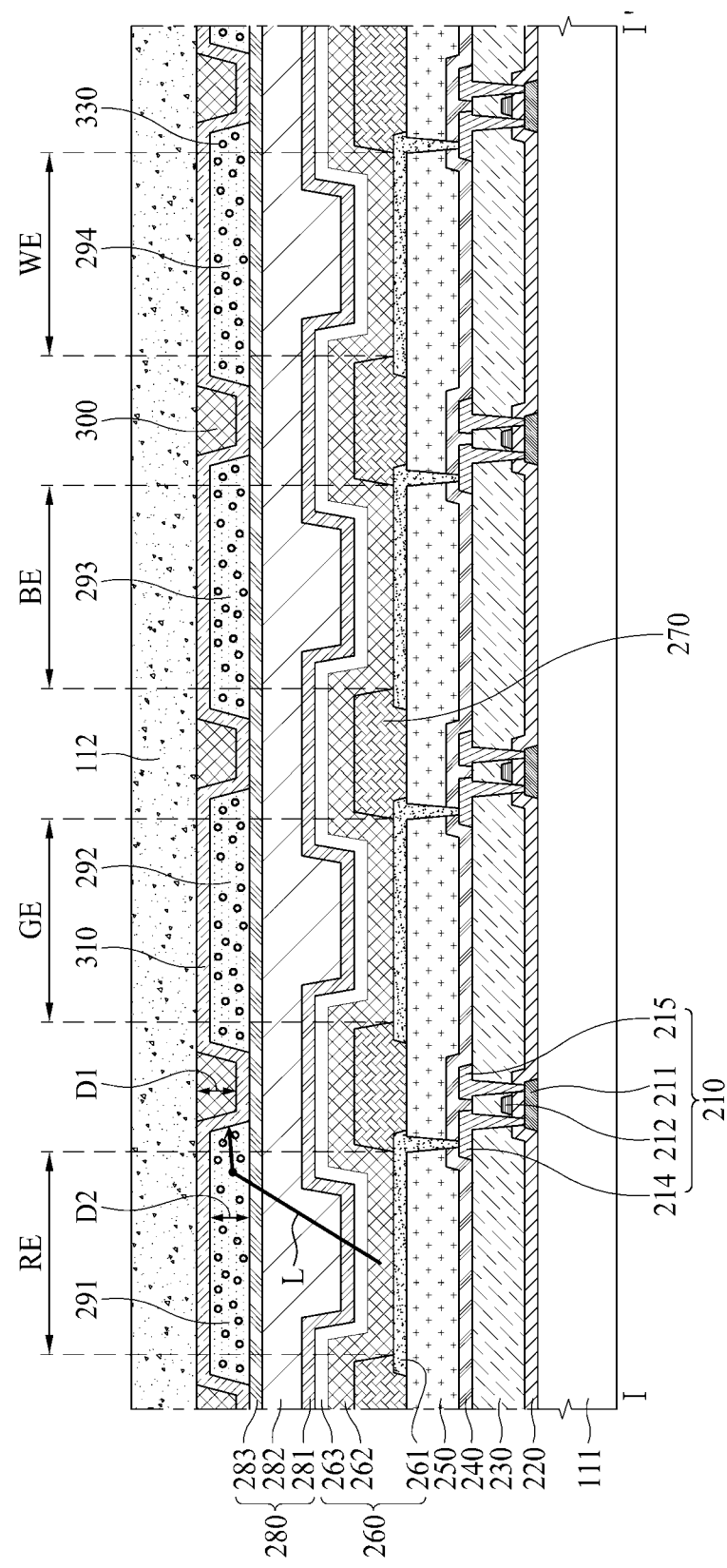
FIG. 9 is a cross-sectional view taken along line I-I' of FIG. 4 according to an embodiment of the present disclosure.

FIG. 9 is a cross-sectional view taken along line I-I' of FIG. 4 according to another embodiment of the present disclosure.

The cross-sectional view of FIG. 9 is as substantially described above with reference to FIG. 5, except that the first to third color filters 291 to 293 and the transparent organic layer 294 include particles 330 for scattering a light.

The particles 330 may be TiO2 or SiO2. A size of each of the particles 330 may be 0.05 μm to 1 μm. As the size of each of the particles 330 increases, the first to third color filters 291 to 293 and the transparent organic layer 294 may be lowered in transmittance or may become higher in scattering rate. Accordingly, the size of each of the particles 330 may be previously determined based on a transmittance and a scattering rate of each of the first to third color filters 291 to 293 and the transparent organic layer 294.

Head-mounted displays (HMDs) are glasses-type monitor devices for virtual reality (VR) or augmented reality (AR), which are worn in a glasses type or a helmet type and form a focal point at a distance close to eyes of a user, and a small organic light emitting display device having a high resolution may be applied to the HMDs. In an embodiment of the present disclosure, since the first to third color filters 291 to 293 and the transparent organic layer 294 each include the particles 330, lights emitted from the emissive areas RE, GE, BE, and WE may be diffused and displayed. As a result, in an embodiment of the present disclosure, if the organic light emitting display device is applied to the HMDs, the black matrix is prevented from being seen in a lattice pattern.

Figure 10A:
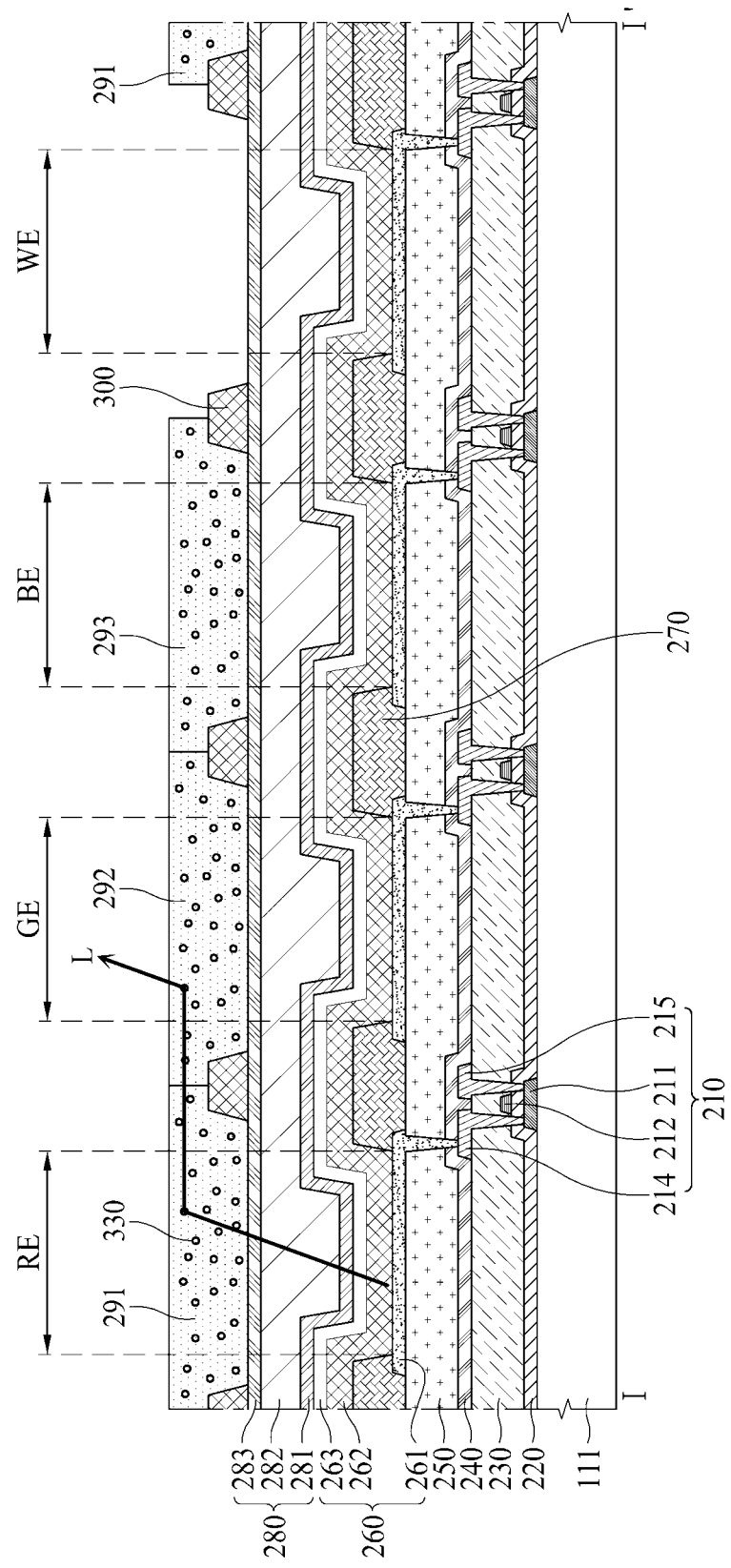
FIGS. 10A to 10C are cross-sectional views illustrating different structures including a color filter including particles for scattering a light.
Figure 10B:
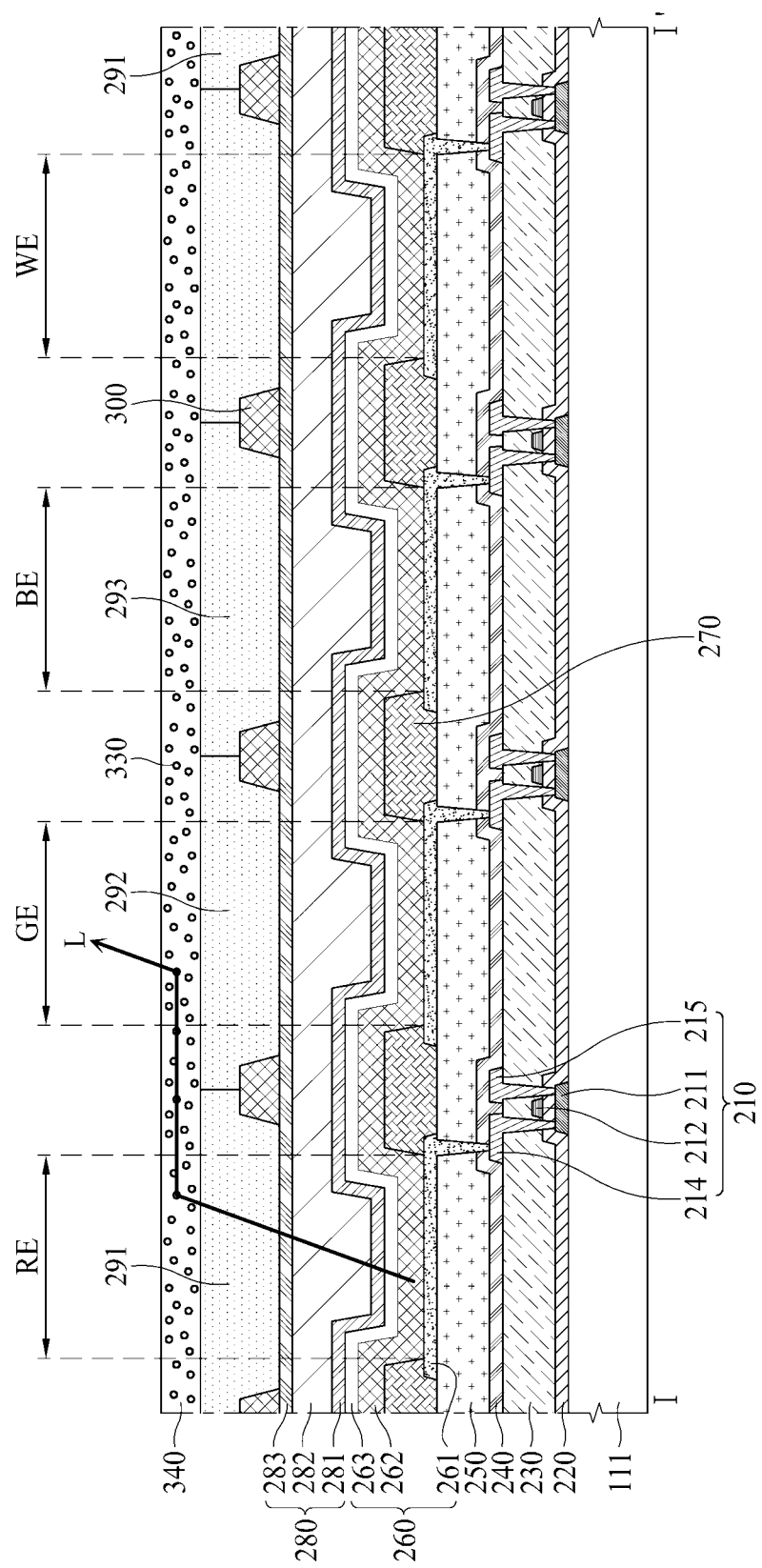
Figure 10C:
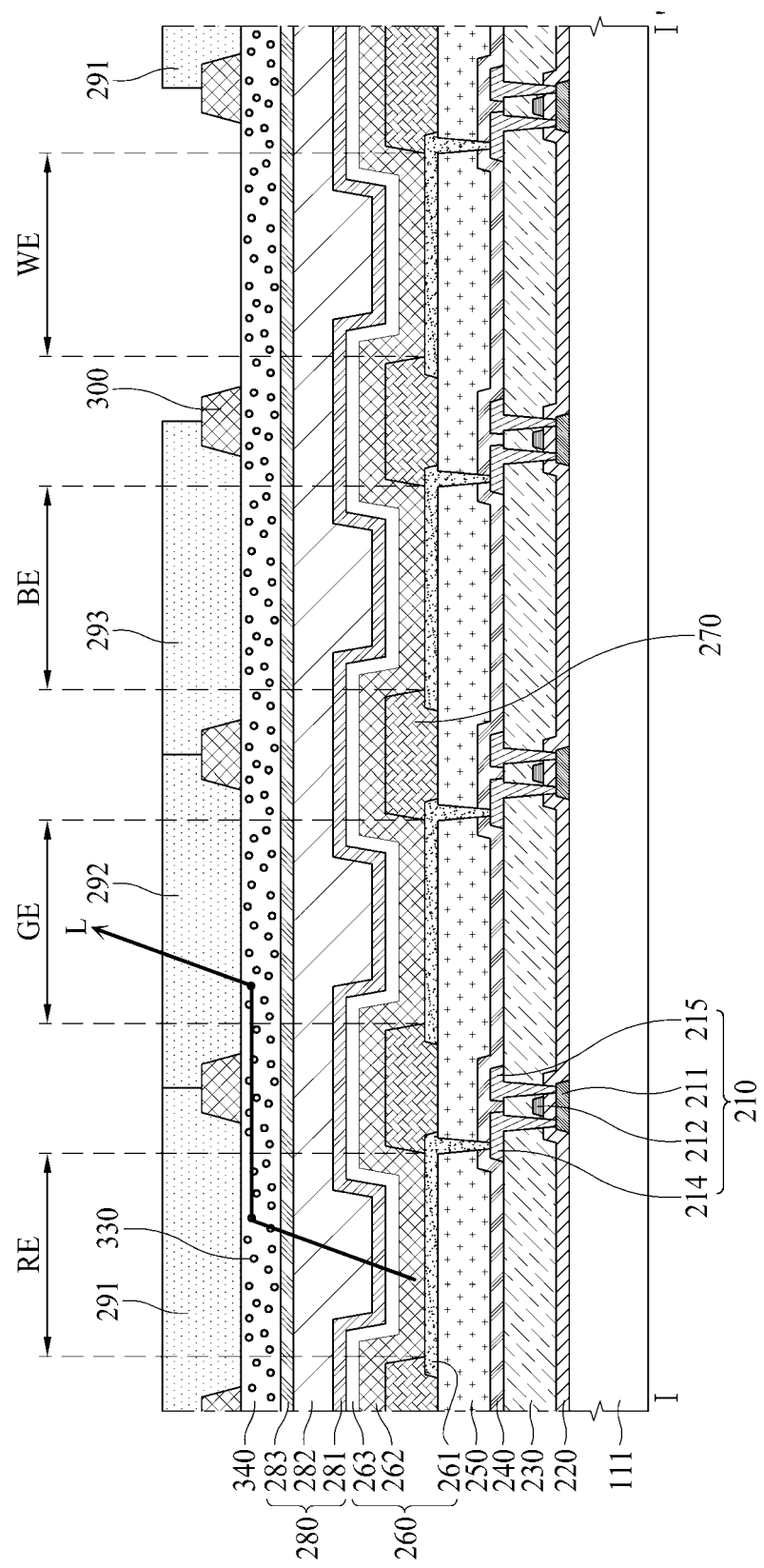

FIGS. 10A to 10C are cross-sectional views illustrating different structures including a color filter including particles according to embodiments of the present disclosure.

In FIG. 10A, a structure where first to third color filters 291 to 293 are disposed on a black matrix 300 is illustrated. Referring to FIG. 10A, light L emitted from an organic light emitting layer 262 included in a red emissive area RE may be scattered by particles 330 of the first color filter 291 to travel to the second color filter 292, scattered by particles 330 of the second color filter 292, and output through an upper portion of the second color filter 292. That is, light emitted from an organic light emitting layer 262 included in one emissive area may travel to a color filter included in an emissive area adjacent to the one emissive area, causing color mixing.

In FIG. 10B, a structure where a scattering layer 340 including particles 330 are disposed on the first to third color filters 291 to 293 is illustrated. Referring to FIG. 10B, the light L emitted from the organic light emitting layer 262 included in the red emissive area RE may pass through the first color filter 291, may be scattered by particles 330 of the scattering layer 340 to travel to a green emissive area GE, may be scattered by particles 330 in the green emissive area GE, and may be output. That is, light emitted from an organic light emitting layer 262 included in one emissive area may travel to a color filter included in an emissive area adjacent to the one emissive area, and for this reason, blur occurs, causing a reduction in visibility and sharpness of an image.

In FIG. 10C, a structure where the scattering layer 340 including the particles 330 is disposed on an encapsulation layer 280 and the black matrix 300 and the first to third color filters 291 to 293 are disposed on the scattering layer 340 is illustrated. Referring to FIG. 10C, the light L emitted from the organic light emitting layer 262 included in the red emissive area RE may be scattered by the particles 330 of the scattering layer 340 to travel to the green emissive area GE, and may be scattered by the particles 330 in the green emissive area GE to pass through the second color filter 292. That is, light emitted from an organic light emitting layer 262 included in one emissive area travels to a color filter included in an emissive area adjacent to the one emissive area, causing color mixing.

On the other hand, in an embodiment of the present disclosure, since the black matrix 300 is disposed between the first to third color filters 291 to 293 and the transparent organic layer 294, as in FIG. 9, light emitted from the organic light emitting device 260 included in one emissive area RE is prevented from being scattered by the particles 330 of one color filter 291 to travel to a color filter of an emissive area adjacent to the one emissive area RE. That is, in an embodiment of the present disclosure, occurrence of color mixing and blurring is prevented.

Figure 11:
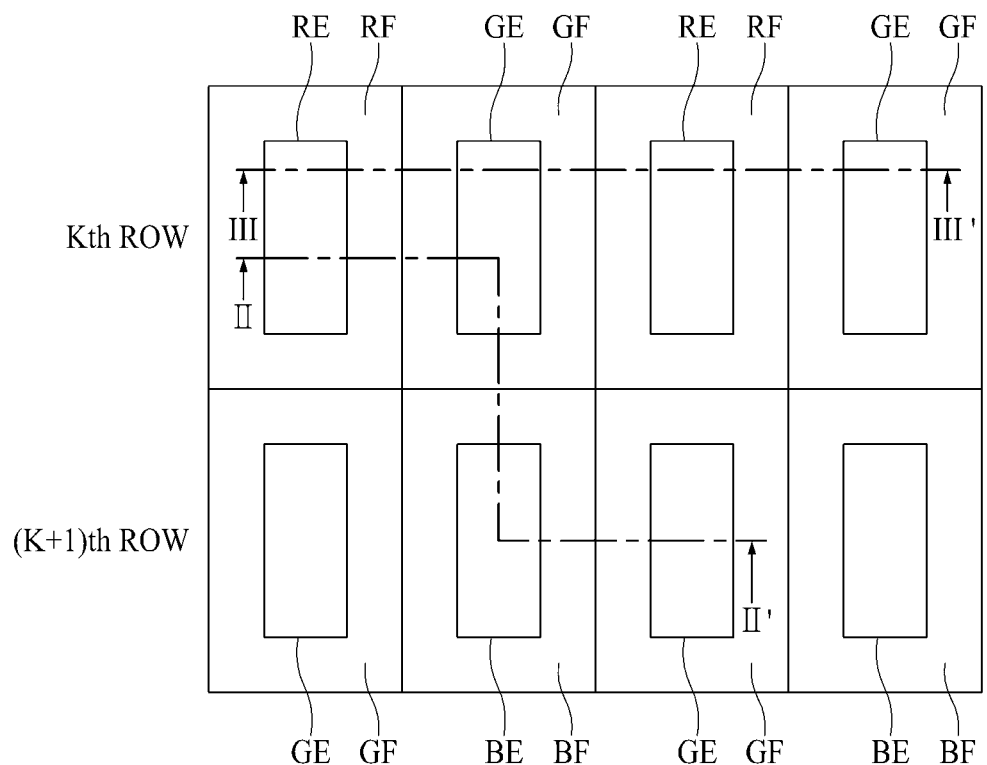
FIG. 11 is a plan view illustrating another example of pixels in a display area.

FIG. 11 is a plan view illustrating another example of pixels in a display area. In FIG. 11, for convenience of description, only a plurality of emissive areas RE, GE, and BE and a plurality of color filters RF, GF, and BF included in a plurality of pixels are illustrated.

Referring to FIG. 11, each of the emissive areas RE, GE, and BE may be an area where a first electrode corresponding to an anode electrode, an organic light emitting layer, and a second electrode corresponding to a cathode electrode are sequentially stacked, and thus, a hole from the first electrode and an electron from the second electrode are combined in the organic light emitting layer to emit light.

The organic light emitting layer of each of the emissive areas RE, GE, and BE is formed as a common layer in the emissive areas RE, GE, and BE and may emit white light. A first color filter RF may be disposed in correspondence with a red emissive area RE, a second color filter GF may be disposed in correspondence with a green emissive area GE, and a third color filter BF may be disposed in correspondence with a blue emissive area BE. Therefore, the red emissive area RE may emit red light by using the first color filter RF, the green emissive area GE may emit green light by using the second color filter GF, and the blue emissive area BE may emit blue light by using the third color filter BF. A red subpixel may include the red emissive area RE, a green subpixel may include the green emissive area GE, and a blue subpixel may include the blue emissive area BE.

In an embodiment of the present disclosure, each of color filters may be provided between the same color filters different therefrom. For example, as illustrated in FIG. 11, a red subpixel may be disposed between green subpixels in a kth (where k is a positive integer) row, and a blue subpixel may be disposed between green subpixels in a k+1st row. That is, only red and green subpixels may be disposed in the kth row, and green and blue subpixels may be disposed in the k+1st row. Thus, the red subpixel and the green subpixel are disposed in the same row of the array and the green subpixel and the blue subpixel are disposed in the same column of the array.

Moreover, the red subpixel in the kth row and the green subpixel in the k+1st row may be disposed adjacent to each other, and the green subpixel in the kth row and the blue subpixel in the k+1st row may be disposed adjacent to each other. That is, the green subpixel in the kth row and the green subpixel in the k+1st row may be disposed in a diagonal direction.

In an embodiment of the present disclosure, due to such arrangement, one red subpixel, two green subpixels, and one blue subpixel may be defined as one unit pixel.

Moreover, an embodiment of the present disclosure is not limited to the embodiment of FIG. 11. In other embodiments, a red subpixel may be disposed between green subpixels in a jth (where j is a positive integer) column, and a blue subpixel may be disposed between green subpixels in a j+1st row.

As described above, in an embodiment of the present disclosure, since the first and third color filters 291 and 293 are disposed between the second color filters 292, as in FIG. 11, the first to third color filters 291 to 293 may be divided without the black matrix which divides the red, green, and blue color filters RF, GF, and BF.

Figure 12A:
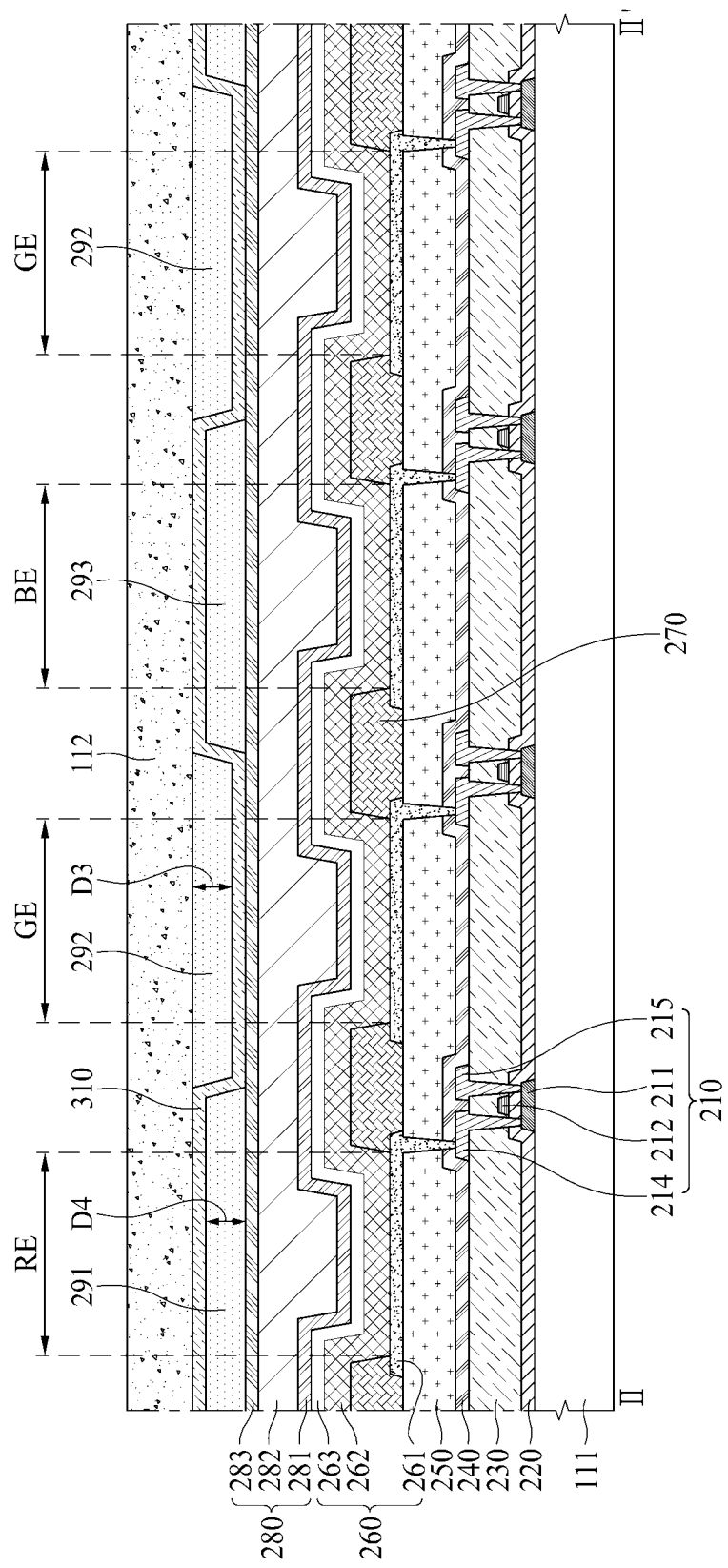
FIG. 12A is a cross-sectional view taken along line II-II' of FIG. 11 according to an embodiment of the present disclosure.

FIG. 12A is a cross-sectional view taken along line II-II' of FIG. 11 according to an embodiment of the present disclosure.

The cross-sectional view of FIG. 12A is as substantially described above with reference to FIG. 5, except for the differences in the arrangement of the first to third color filters 291 to 293, an inorganic layer 310, and a second substrate 112.

Referring to FIG. 12A, the first and third color filters 291 and 293 may be disposed on an encapsulation layer 280. The first and third color filters 291 and 293 may be spaced apart from each other by a certain interval.

The first color filter 291 may be a red color filter disposed in correspondence with a red emissive area RE, and the third color filter 293 may be a blue color filter disposed in correspondence with a blue emissive area BE. The first color filter 291 may be formed of an organic layer including a red pigment, and the third color filter 293 may be formed of an organic layer including a blue pigment.

An inorganic layer 310 may be formed on the first and third color filters 291 and 293. That is, as in FIG. 12A, the inorganic layer 310 may be formed to cover the first and third color filters 291 and 293 as well as a space between the first and third color filters 291 and 293. Thus, the inorganic layer 310 is disposed between the first color filter 291 and the second color filter 292, and between the second color filter 292 and the third color filter 293, and below at least one of the first color filter 291, the second color filter 292, and the third color filter 293. The inorganic layer 310 may be formed of a transparent conductive material (or TCO), such as ITO or IZO, or may be formed of SiOx, SiNx, or a multilayer thereof.

The second color filter 292 may be formed on the inorganic layer 310 and between the first and third color filters 291 and 293. The second color filter 292 may be a green color filter which is disposed in correspondence with a green emissive area GE. The second color filter 292 may be formed of an organic layer including a green pigment.

The second color filter 292 may be filled between the first and third color filters 291 and 293. Since the second color filter 292 is formed through dry etching, a thickness D3 of the second color filter 292 may be thinner than a thickness D4 of each of the first and third color filters 291 and 293.

As described above, in an embodiment of the present disclosure, since the second color filter 292 is formed between the first and third color filters 291 and 293, the first to third color filters 291 to 293 may be divided without a black matrix BM. Accordingly, in an embodiment of the present disclosure, an aperture ratio of an emissive area is prevented from being reduced due to a process error of each of a black matrix and a color filter.

Moreover, in an embodiment of the present disclosure, since the second color filter 292 is formed between the first and third color filters 291 and 293, a possibility that the first to third color filters 291 to 293 are formed to overlap each other is small. Accordingly, in an embodiment of the present disclosure, color mixing is prevented from occurring due to a process error of each of a black matrix and a color filter.

Furthermore, in an embodiment of the present disclosure, since the second color filter 292 is formed between the first and third color filters 291 and 293, the first and third color filters 291 and 293 may be formed to have a planar surface disposed on the same layer as a planar surface of the inorganic layer 310 on the second color filter 292. In other words, a top surface of the second color filter 292 may be level with a top surface of the inorganic layer 310 on the first color filter 291 and the third color filter 293. Accordingly, in an embodiment of the present disclosure, an overcoat layer for planarizing step heights of the color filters may not be formed on the first and third color filters 291 and 293 and the inorganic layer 310.

A second substrate 112 may be attached on the second color filter 292 and the inorganic layer 310. The second substrate 112 may be an encapsulation film.

Figure 12B:
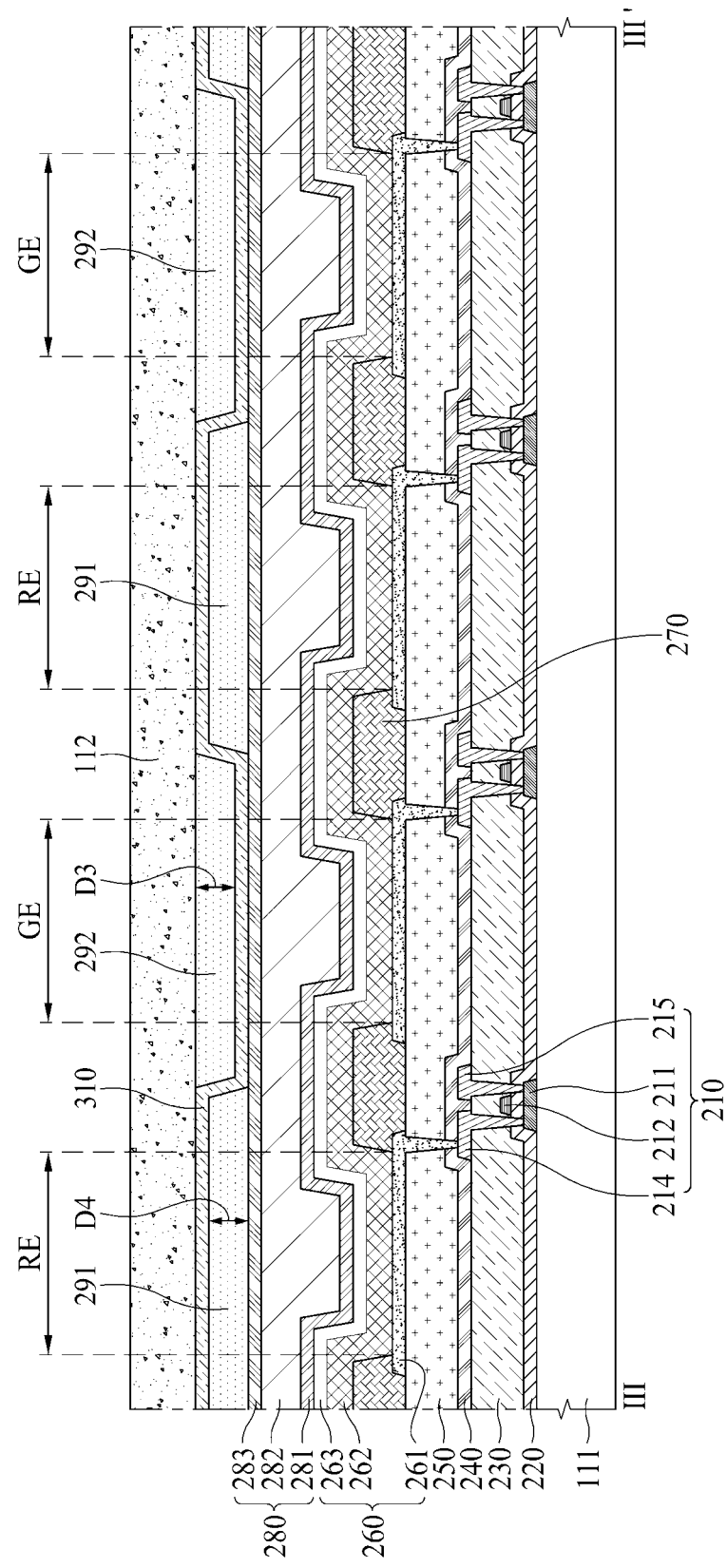
FIG. 12B is a cross-sectional view taken along line III-III' of FIG. 11 according to an embodiment of the present disclosure.

FIG. 12B is a cross-sectional view taken along line of FIG. 11 according to an embodiment of the present disclosure.

The cross-sectional view of FIG. 12B is substantially similar to that described above with reference to FIG. 12A, except that the cross-sectional view is taken along line of FIG. 11, and the third color filter 293 is shown replaced with another first color filter 291.

Figure 13:
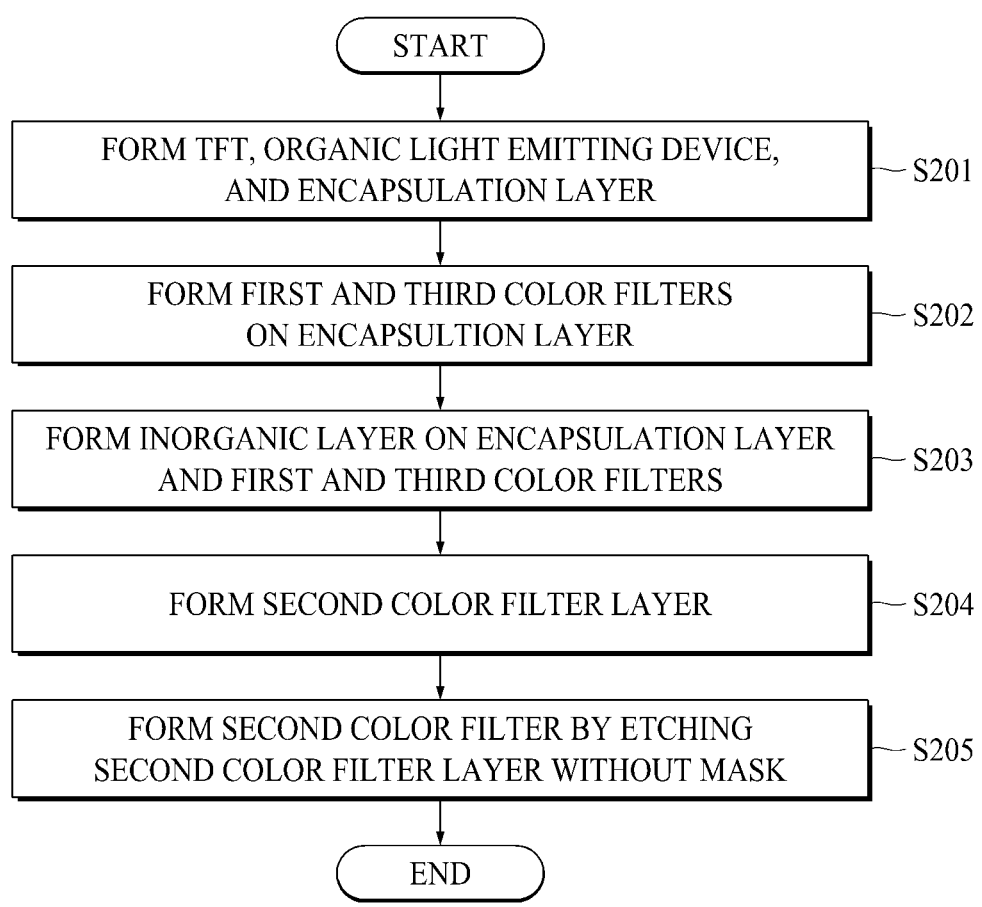
FIG. 13 is a flowchart illustrating a method of manufacturing a display device according to another embodiment of the present disclosure.

FIG. 13 is a flowchart illustrating a method of manufacturing a display device according to another embodiment of the present disclosure. FIGS. 14A to 14F are cross-sectional views taken along line for describing a method of manufacturing a display device according to another embodiment of the present disclosure.

The cross-sectional views illustrated in FIGS. 14A to 14F relate to the method of manufacturing the display device illustrated in FIG. 12A, and thus, like reference numerals refer to like elements. Hereinafter, a method of manufacturing a display device according to another embodiment of the present disclosure will be described in detail with reference to FIGS. 13 and 14A to 14F.

Figure 14A:
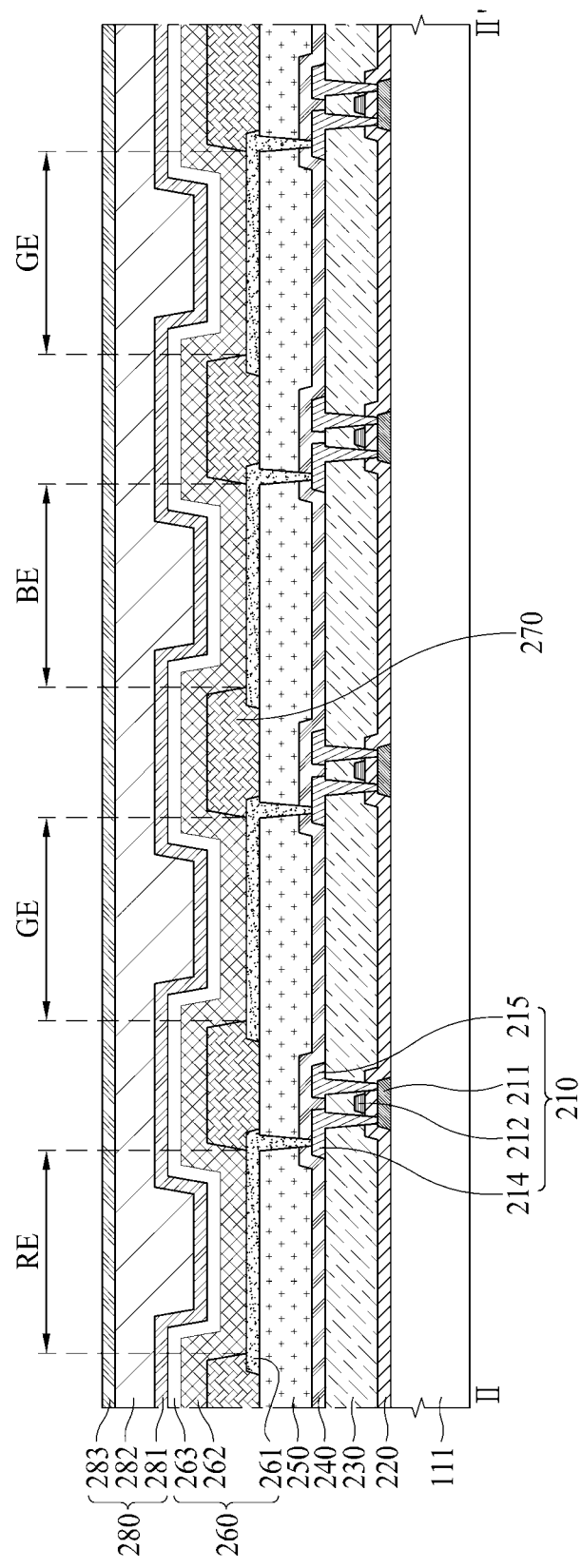
FIGS. 14A to 14F are cross-sectional views taken along line II-II' for describing a method of manufacturing a display device according to another embodiment of the present disclosure.

First, as illustrated in FIG. 14A, a TFT 210, an organic light emitting device 260, and an encapsulation layer 280 may be formed. Operation S201 of FIG. 13 is substantially the same as operation S101 of FIG. 6, and thus, description on operation S201 of FIG. 13 is omitted. (S201 of FIG. 13)

Figure 14B:
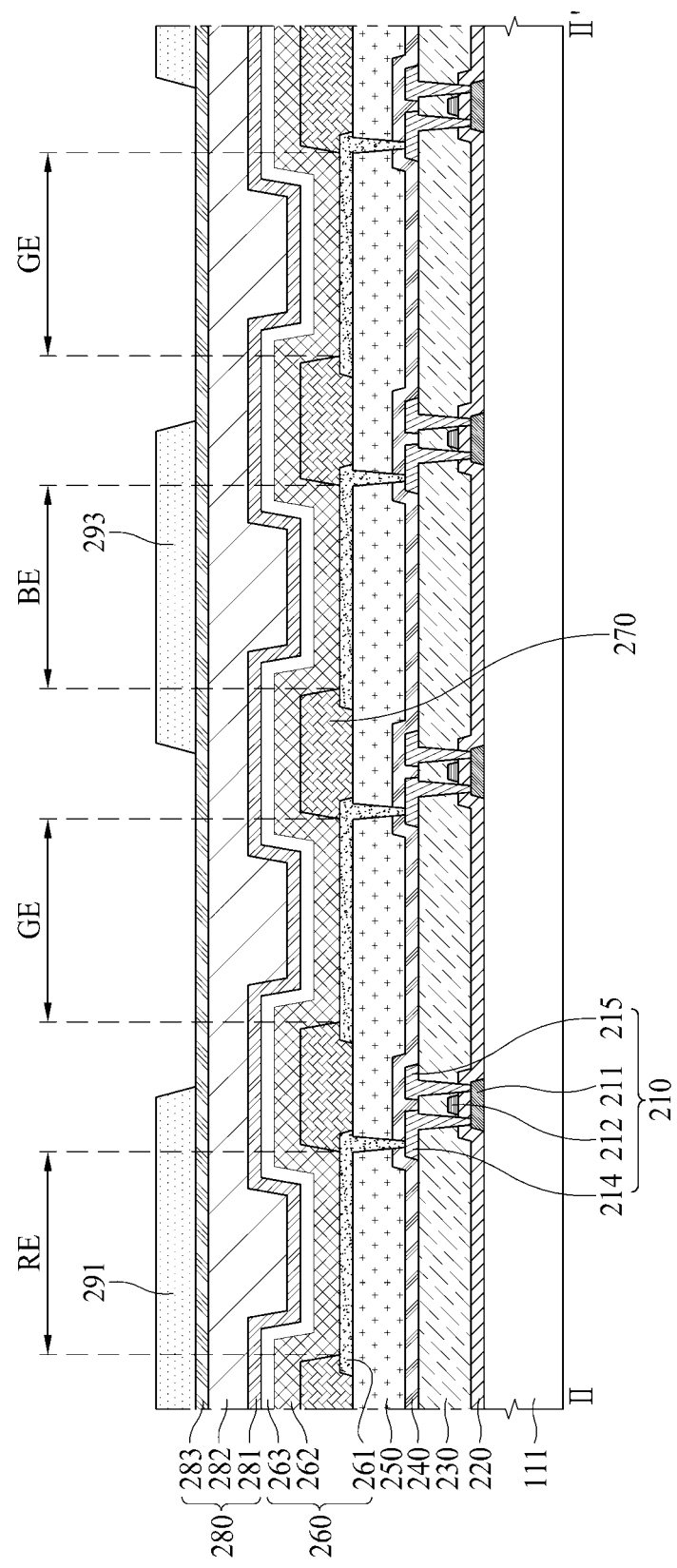

Second, as illustrated in FIG. 14B, a first color filter 291 may be formed on the encapsulation layer 280 to correspond to red emissive areas RE, and a third color filter 293 may be formed to correspond to blue emissive areas BE.

In detail, an organic material including a red pigment may be coated on the encapsulation layer 280, and by performing a photo process, a first color filter 291 may be formed in the red emissive areas RE. The first color filter 291 may be a red color filter RF. Also, an organic material including a blue pigment may be coated on the encapsulation layer 280, and by performing the photo process, a third color filter 293 may be formed in the blue emissive areas BE. The third color filter 293 may be a blue color filter BF. (S202 of FIG. 13)

Figure 14C:
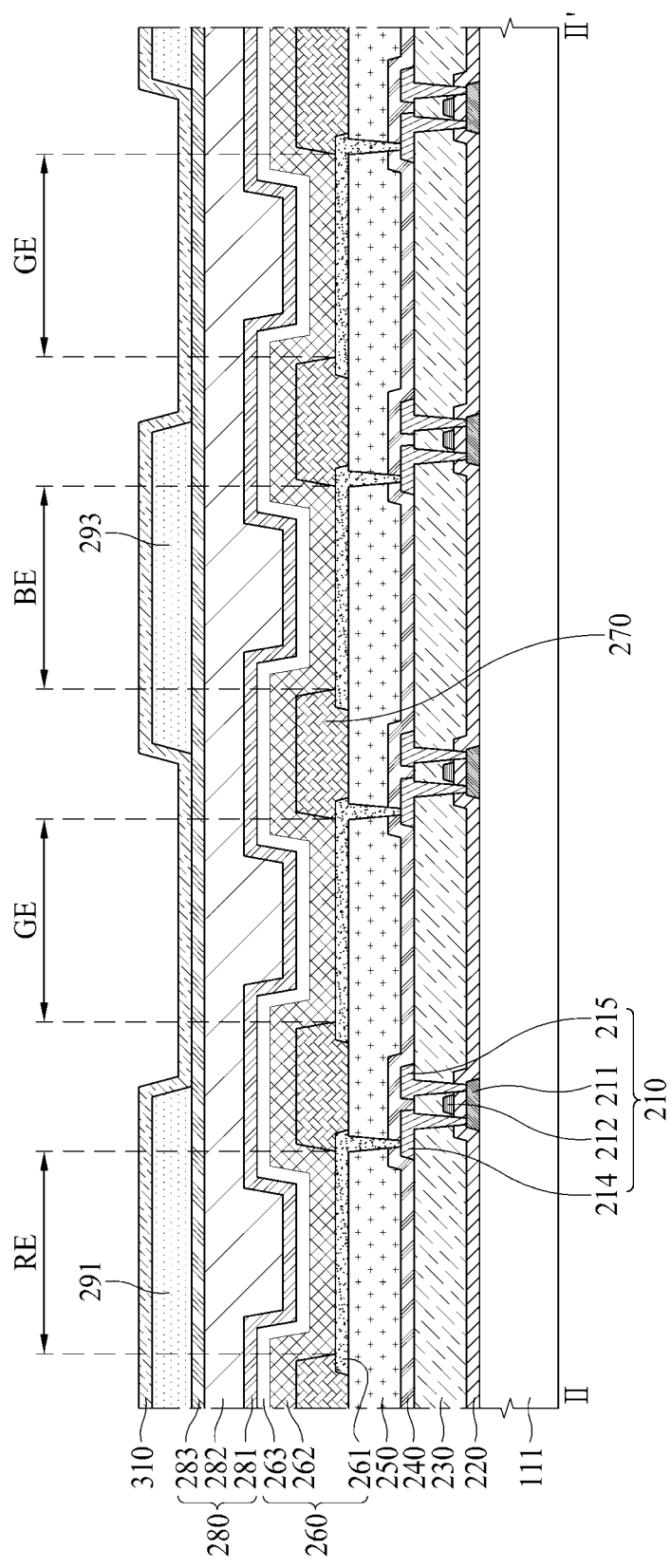

Third, as illustrated in FIG. 14C, an inorganic layer 310 may be formed on the first and third color filters 291 and 293.

The inorganic layer 310 may be formed to cover the first and third color filters 291 and 293 and a space between the first and third color filters 291 and 293. The inorganic layer 310 may be disposed on an entire top surface of the first color filter 291 and the third color filter 293, and may also be disposed below an entire bottom surface of the second color filter 292. The inorganic layer 310 may be formed of a transparent conductive material (or TCO), such as ITO or IZO, or may be formed of SiOx, SiNx, or a multilayer thereof. If the inorganic layer 310 is formed of a transparent metal material, the inorganic layer 310 may be formed through a sputtering process. If the inorganic layer 310 is formed of SiOx, SiNx, or a multilayer thereof, the inorganic layer 310 may be formed through a CVD process. (S203 of FIG. 13)

Figure 14D:
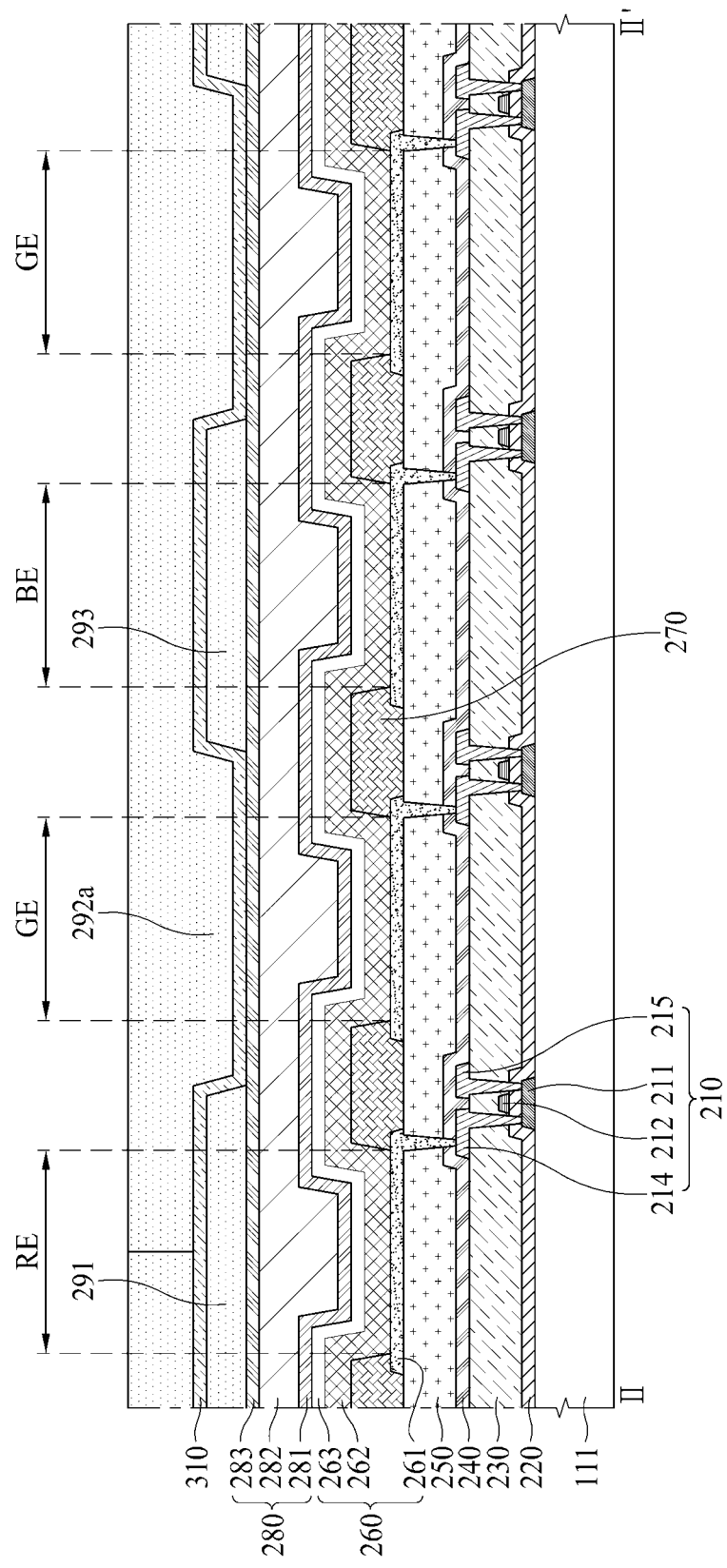

Fourth, as illustrated in FIG. 14D, a second color filter layer 292a may be formed to cover the inorganic layer 310. The second color filter layer 292a may be an organic material including a green pigment. (S204 of FIG. 13)

Figure 14E:
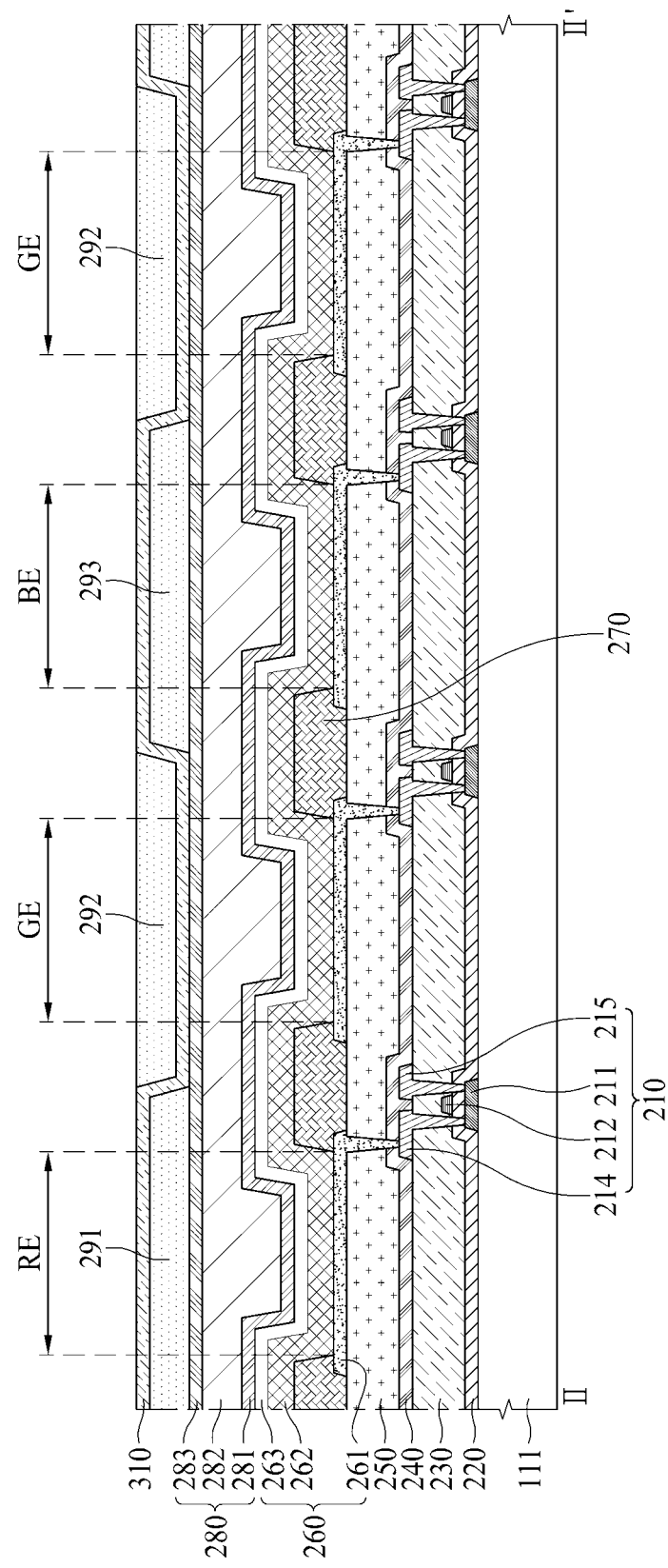

Sixth, as illustrated in FIG. 14E, a second color filter 292 may be formed by etching the second color filter layer 292a through dry etching without a mask.

A material applied to the dry etching may be a mixed gas of $O_2$ and $CF_4$. For example, a weight ratio (wt %) of $O_2$ to $CF_4$ may be 60:150, but is not limited thereto. In a case of dry-etching an organic layer and an inorganic layer by using the mixed gas of $O_2$ and $CF_4$, an etching rate of the organic layer to the inorganic layer may be 100:1 to 10:1. For example, if the inorganic layer 310 is formed of a transparent metal material (or TCO), the etching rate of the organic layer to the inorganic layer may be about 100:1. If the inorganic layer 310 is formed of SiOx, SiNx, or a multilayer thereof, the etching rate of the organic layer to the inorganic layer may be about 10:1.

Therefore, even in a case of dry-etching the second color filter layer 292a without a mask, the second color filter layer 292a corresponding to an organic material is mainly etched, and the inorganic layer 310 is hardly etched. That is, the first and third color filters 291 and 293 are protected by the inorganic layer 310 without being etched.

Moreover, by adjusting a dry etching duration, the second color filter layer 292a may be formed to have a planar surface disposed on the same layer as a planar surface of the inorganic layer 310 on the first and third color filters 291 and 293. If a dry etching duration is short, the second color filter layer 292a remains on the inorganic layer 310, causing color mixing. Also, if the dry etching duration is long, the second color filter 292 is thinned in thickness, and thus, the second color filter 292 cannot normally operate. An appropriate dry etching duration may be previously determined through experiments.

Moreover, the second color filter layer 292a is not protected by the inorganic layer 310, but the first and third color filters 291 and 293 are protected by the inorganic layer 310. Accordingly, despite adjusting the dry etching duration, a thickness of each of the first and third color filters 291 and 293 is thinner than a thickness of the second color filter 292.

Moreover, the second color filter layer 292a may be formed through dry etching without a mask, instead of a photolithography process requiring the mask, and thus, the manufacturing cost and a manufacturing time are reduced.

Moreover, since the second color filter layer 292a is not formed through the photolithography process, the second color filter layer 292a may not include a photo initiator.

Furthermore, since the second color filter 292 is formed between the first and third color filters 291 and 293, the second color filter 292 may be formed to have a planar surface disposed on the same layer as a planar surface of the inorganic layer 310 on the first and third color filters 291 and 293. In other words, a top surface of the second color filter 292 may be level with a top surface of the inorganic layer 310 on the first color filter 291 and the third color filter 293. Accordingly, in an embodiment of the present disclosure, an overcoat layer for planarizing step heights of the color filters may not be formed on the second color filter 292 and the inorganic layer 310.

Figure 14F:
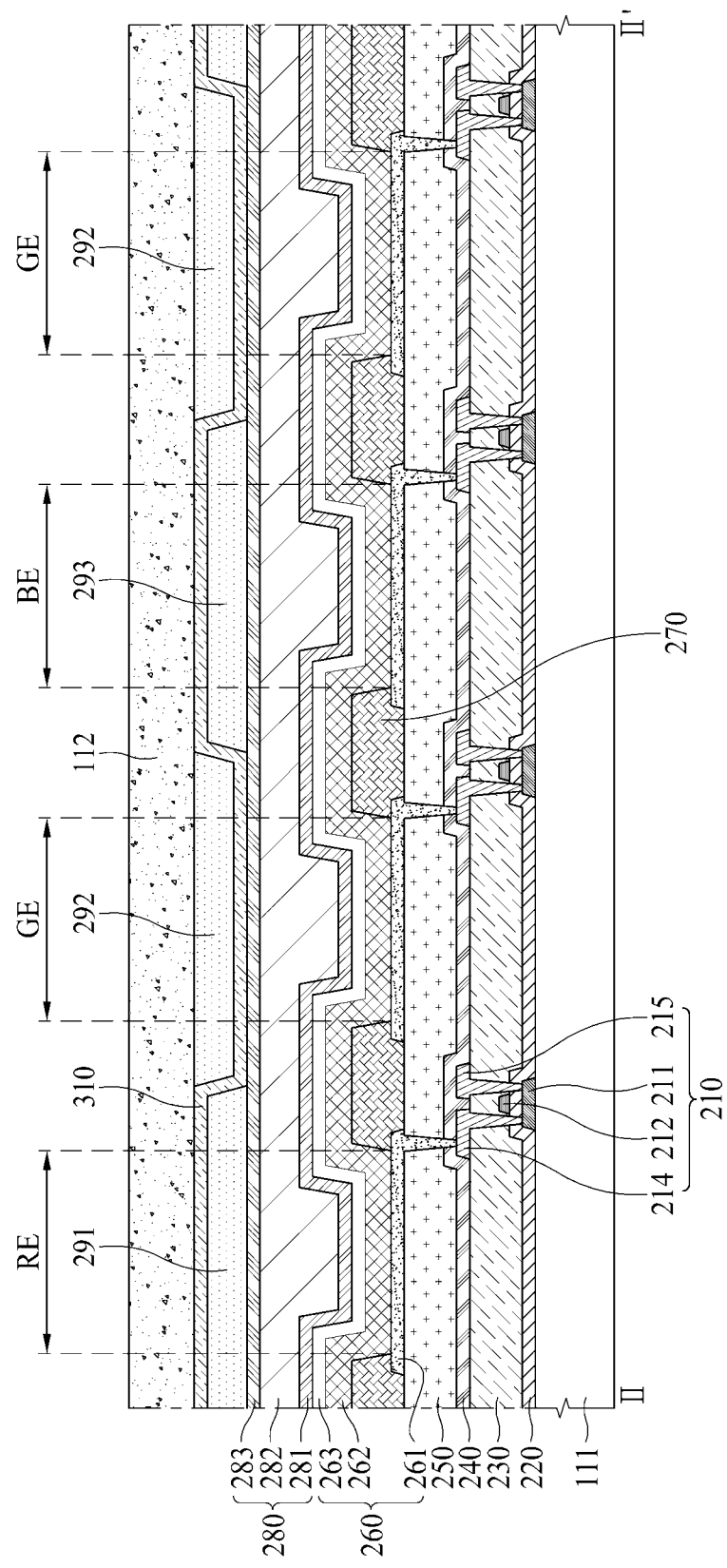

As illustrated in FIG. 14F, a second substrate 112 may be attached on the second color filter 292 and the inorganic layer 310. The second substrate 112 may be an encapsulation film. (S205 of FIG. 13)

The method of manufacturing shown in FIGS. 13 and 14A through 14F can be similarly applied to the embodiment of FIG. 12B, by replacing the blue subpixel with another red subpixel, and the third color filter 293 with another red color filter 291.

Figure 15:
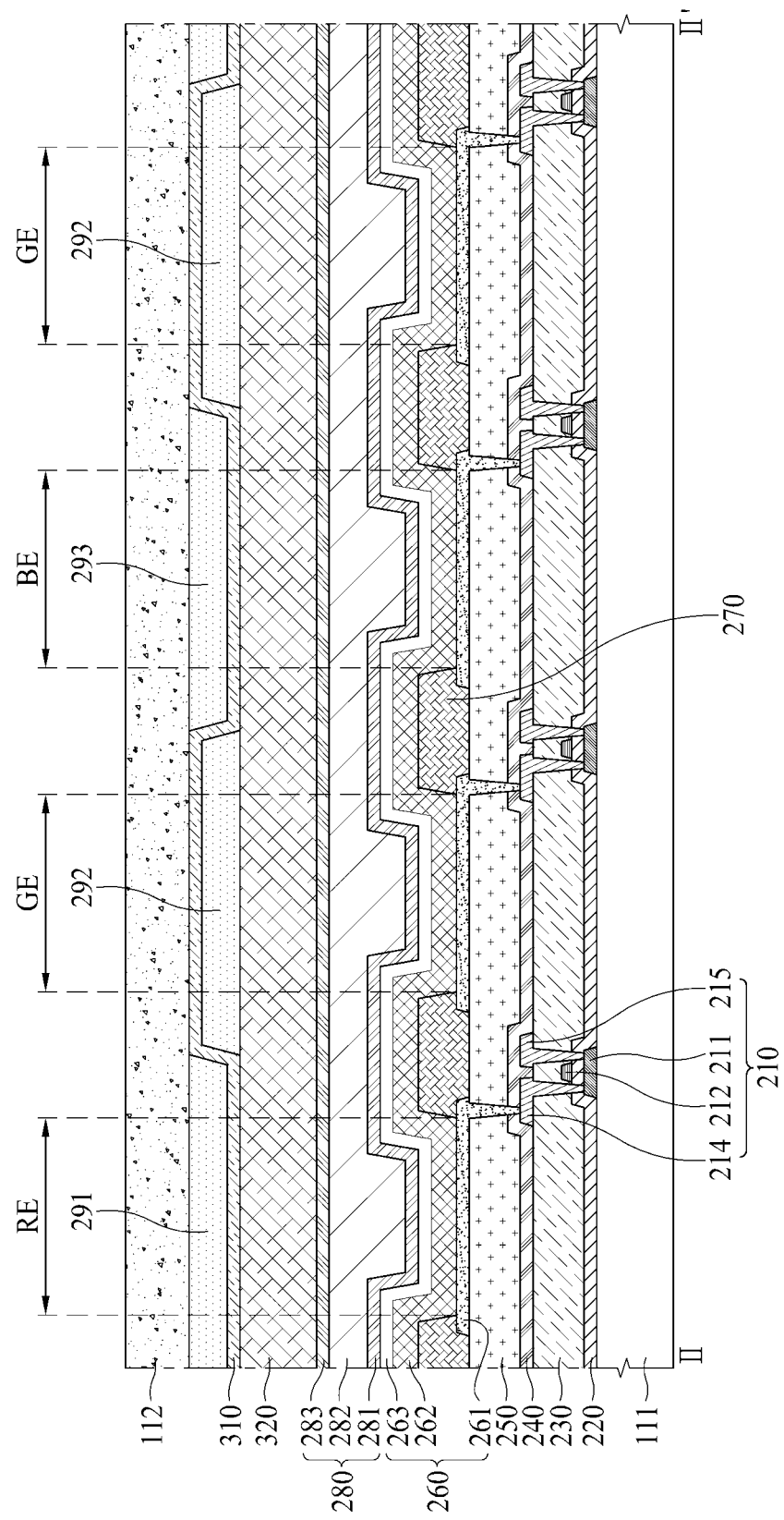
FIG. 15 is a cross-sectional view taken along line II-II' of FIG. 11 according to an embodiment of the present disclosure.

FIG. 15 is a cross-sectional view taken along line II-II' of FIG. 11 according to another embodiment of the present disclosure. The cross-sectional view of FIG. 15 is as substantially described above with reference to FIG. 12A, except that first to third color filters 291 to 293 and an inorganic layer 310 are formed on a second substrate 112 instead of an encapsulation layer 280, and a first substrate 111 is bonded to the second substrate 112 by an adhesive layer 320.

In FIG. 15, the second substrate 112 may be a glass substrate or a plastic substrate. Also, in FIG. 15, the adhesive layer 320 for bonding the first substrate 111 to the second substrate 112 is needed. The adhesive layer 320 may be a transparent adhesive film or a transparent adhesive resin. Furthermore, in FIG. 15, when bonding the first substrate 111 to the second substrate 112, the first substrate 111 and the second substrate 112 may be aligned in order for the first to third color filters 291 to 293 to correspond to red, green, and blue emissive areas RE, GE, and BE.

Moreover, a process of forming the first to third color filters 291 to 293 and the inorganic layer 310 on the second substrate 112 is substantially the same as operations S202 to S205 of FIG. 13, except that the first to third color filters 291 to 293 and the inorganic layer 310 are formed on the second substrate 112 instead of the encapsulation layer 280.

Figure 16A:
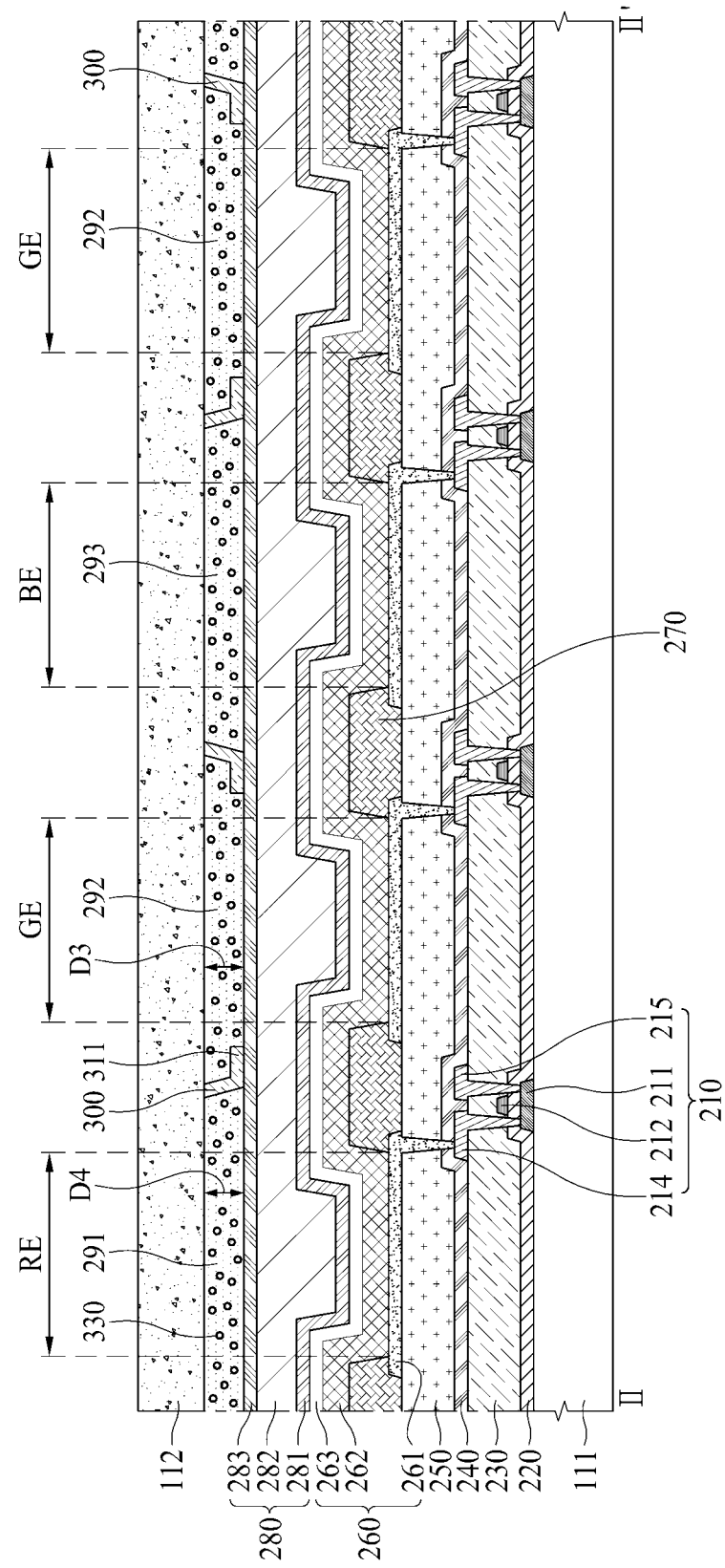
FIG. 16A is a cross-sectional view taken along line II-II' of FIG. 11 according to an embodiment of the present disclosure.

FIG. 16A is a cross-sectional view taken along line II-IP of FIG. 11 according to an embodiment of the present disclosure.

The cross-sectional view of FIG. 16A is as substantially described above with reference to FIG. 12, except that first to third color filters 291 to 293, a black matrix 300, and a second substrate 112.

Referring to FIG. 16A, the first and third color filters 291 and 293 may be disposed on an encapsulation layer 280. The first and third color filters 291 and 293 may be spaced apart from each other by a certain interval.

The first color filter 291 may be a red color filter disposed in correspondence with a red emissive area RE, and the third color filter 293 may be a blue color filter disposed in correspondence with a blue emissive area BE. The first color filter 291 may be formed of an organic layer including a red pigment, and the third color filter 293 may be formed of an organic layer including a blue pigment. Each of the first and third color filters 291 and 293, as in FIG. 9, may include particles 330, but the present embodiment is not limited thereto. In other embodiments, the particles 330 may be omitted.

The second color filter 292 may be formed between the first and third color filters 291 and 293. The second color filter 292 may be a green color filter which is disposed in correspondence with a green emissive area GE. The second color filter 292 may be formed of an organic layer including a green pigment. The second color filter 292, as in FIG. 9, may include particles 330, but the present embodiment is not limited thereto. In other embodiments, the particles 330 may be omitted.

Moreover, since the second color filter 292 is formed through dry etching, a thickness D3 of the second color filter 292 may be thinner than a thickness D4 of each of the first and third color filters 291 and 293.

The black matrix 300 may be formed between the first and second color filters 291 and 292 and between the second and third color filters 292 and 293. The black matrix 300 may be formed of Al or Ag which is metal having high reflectivity. In an embodiment of the present disclosure, since the black matrix 300 is formed of a reflective metal layer, light L traveling to the black matrix 300 may be totally reflected and output, and thus, light efficiency is further improved than a case where the black matrix 300 is formed of a light-absorbing material.

Moreover, the black matrix 300 may include a tail portion 311 extending from a lower portion of the black matrix 300. The tail portion 311 may be formed on the encapsulation layer 280 and may be covered by the second color filter 292. Thus, the black matrix 300 may have a first part disposed between the first color filter 291 and the second color filter 292 and below at least a portion of the second color filter 292 that physically separates the second color filter 292 from the first color filter 291. Similarly, the black matrix 300 may have a second part disposed between the second color filter 292 and the third color filter 293 and below at least a portion of the second color filter 292 that physically separates the second color filter 292 from the third color filter 293.

A second substrate 112 may be attached on the second color filter 292 and the back matrix 300. The second substrate 112 may be an encapsulation film.

Figure 16B:
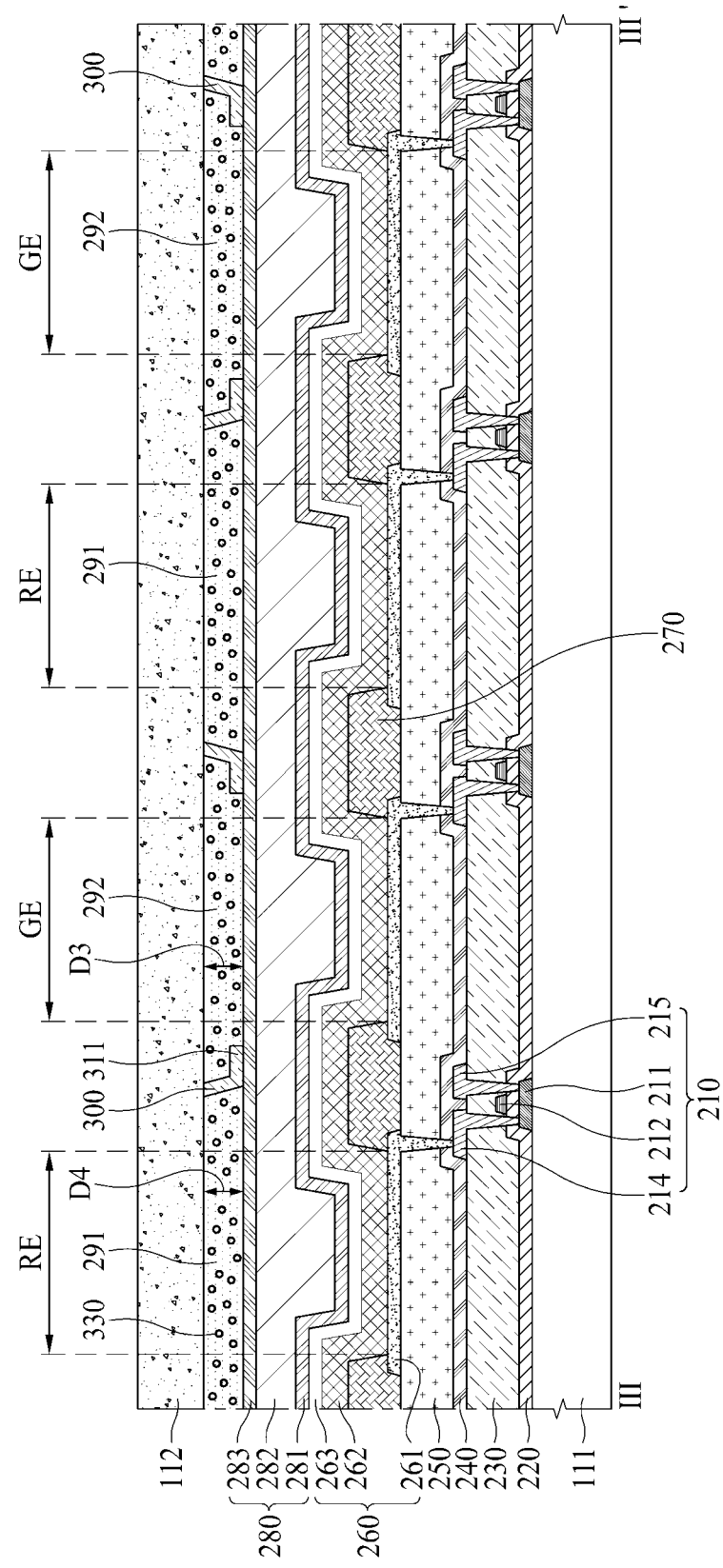
FIG. 16B is a cross-sectional view taken along line III-III' of FIG. 11 according to an embodiment of the present disclosure.

FIG. 16B is a cross-sectional view taken along line of FIG. 11 according to an embodiment of the present disclosure.

The cross-sectional view of FIG. 16B is substantially similar to that described above with reference to FIG. 16A, except that the cross-sectional view is taken along line of FIG. 11, and the third color filter 293 is replaced with another first color filter 291.

Figure 17:
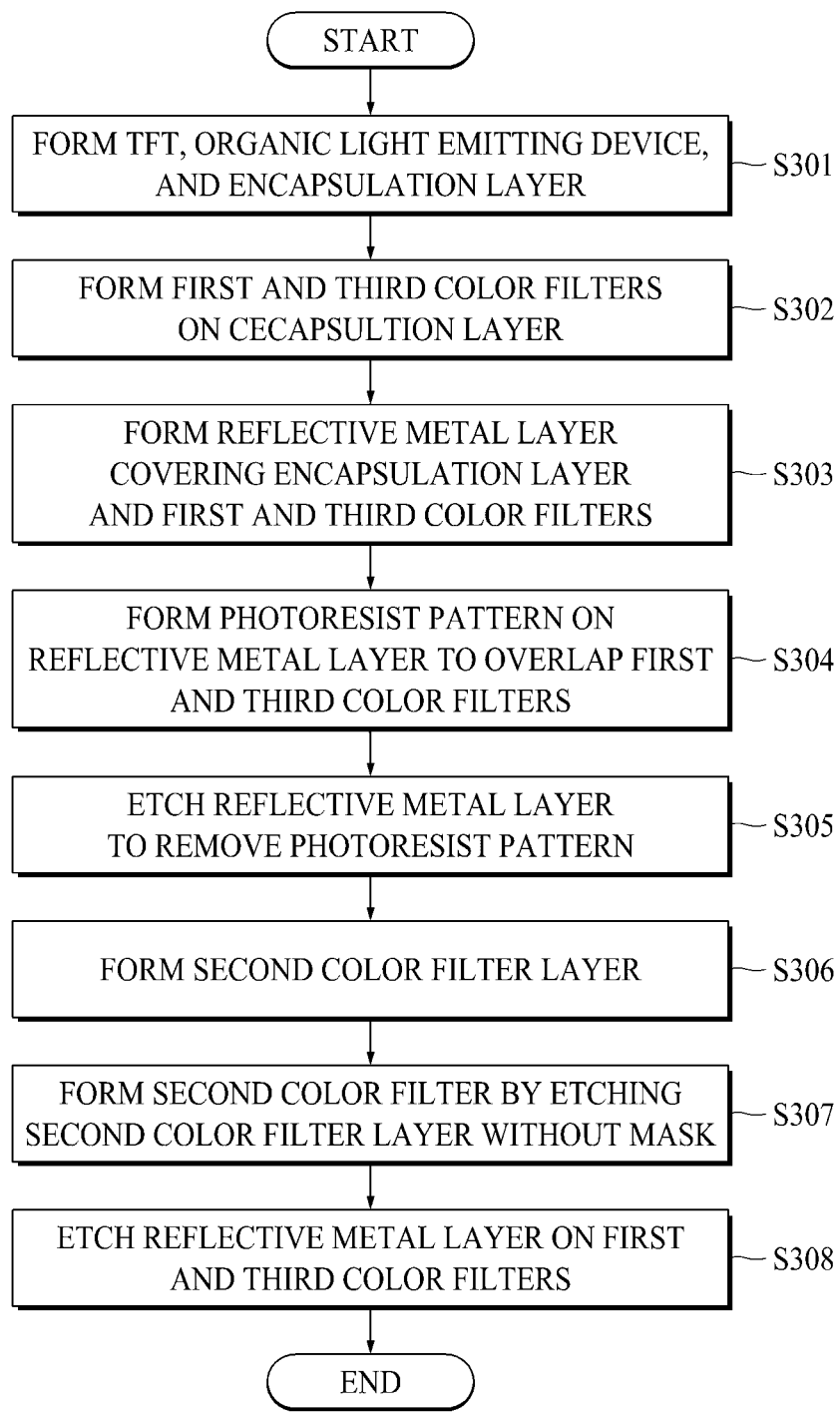
FIG. 17 is a flowchart illustrating a method of manufacturing a display device according to another embodiment of the present disclosure.

FIG. 17 is a flowchart illustrating a method of manufacturing a display device according to another embodiment of the present disclosure. FIGS. 18A to 18H are cross-sectional views taken along line II-II' for describing a method of manufacturing a display device according to another embodiment of the present disclosure.

First, a TFT 210, an organic light emitting device 260, and an encapsulation layer 280 may be formed. Operation S301 of FIG. 17 is substantially the same as operation S101 of FIG. 6, and thus, description on operation S301 of FIG. 17 is omitted. (S301 of FIG. 17)

Second, a first color filter 291 may be formed on the encapsulation layer 280 to correspond to red emissive areas RE, and a third color filter 293 may be formed to correspond to blue emissive areas BE. Operation S302 of FIG. 17 is substantially the same as operation S202 of FIG. 13, and thus, description on operation S302 of FIG. 17 is omitted. (S302 of FIG. 17)

Figure 18A:
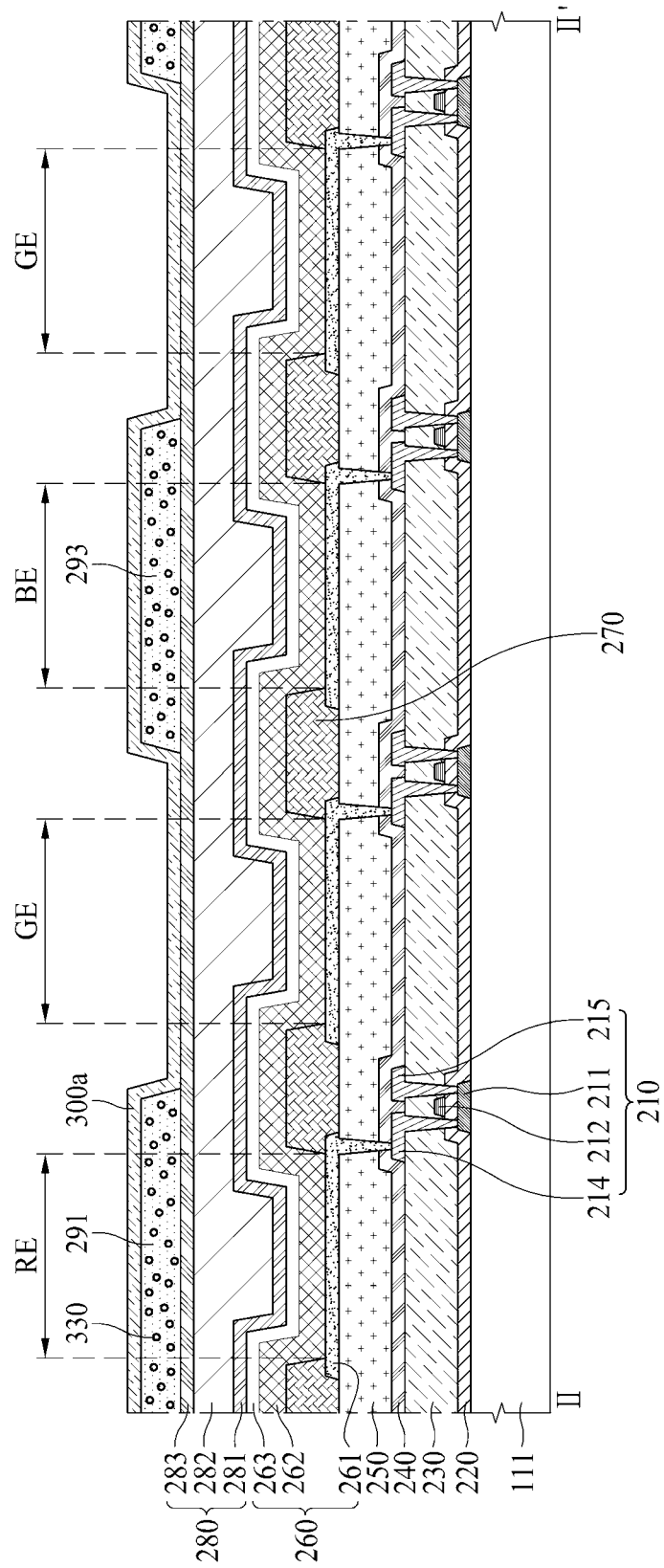

Third, as illustrated in FIG. 18A, a reflective metal layer 300a covering the encapsulation layer 280 and the first and third color filters 291 and 293 may be formed.

In detail, the reflective metal layer 300a may be formed to cover the first and third color filters 291 and 293 and a space between the first and third color filters 291 and 293. The reflective metal layer 300a may be formed of Al or Ag through a sputtering process. (S303 of FIG. 17)

Figure 18B:
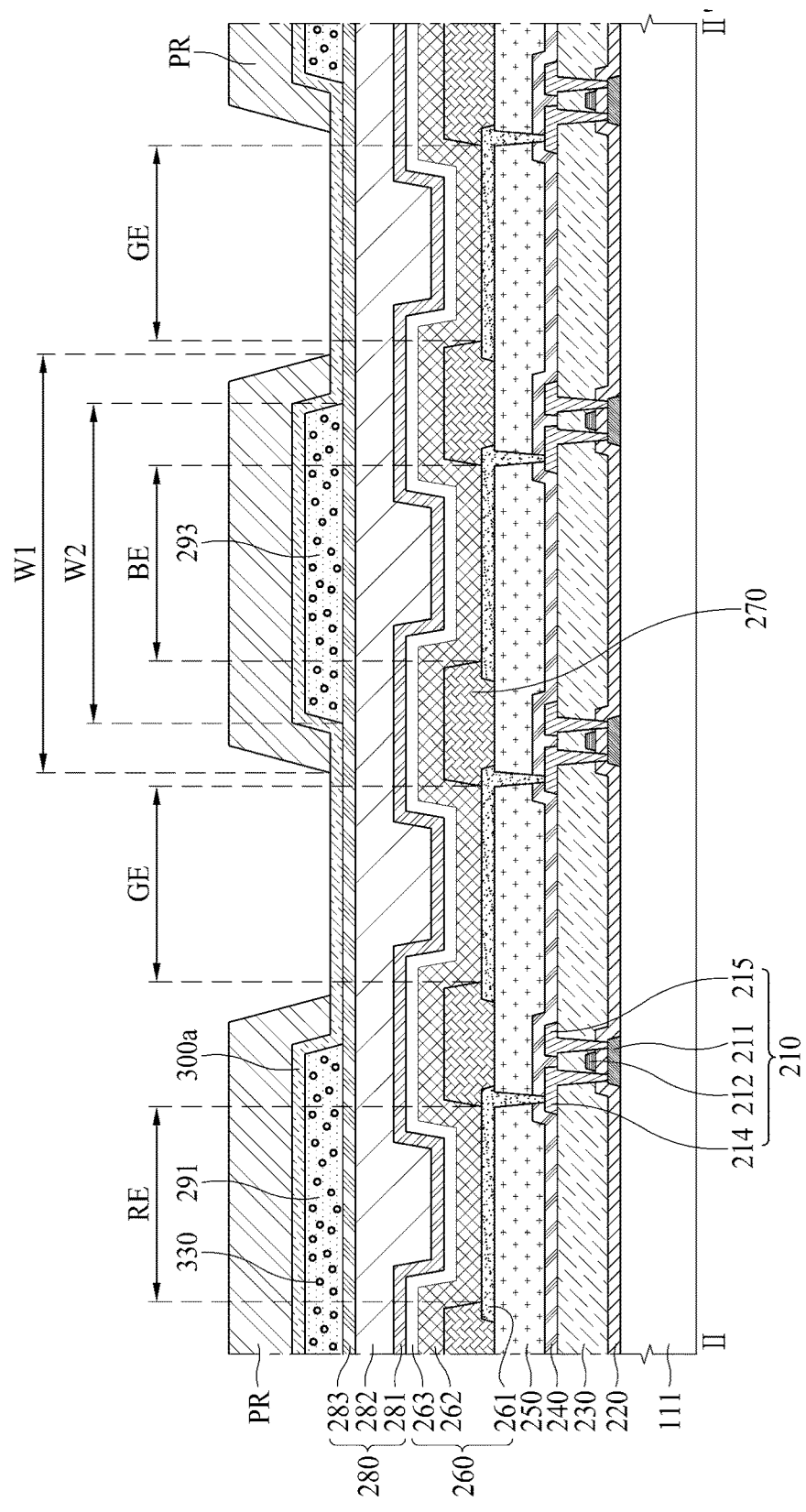

Fourth, as illustrated in FIG. 18B, a photoresist pattern PR may be formed on the reflective metal layer 300a to overlap the first and third color filters 291 and 293. A width W1 of the photoresist pattern PR may be adjusted wider than a width W2 of each of the first and third color filters 291 and 293. (S304 of FIG. 17)

Figure 18C:
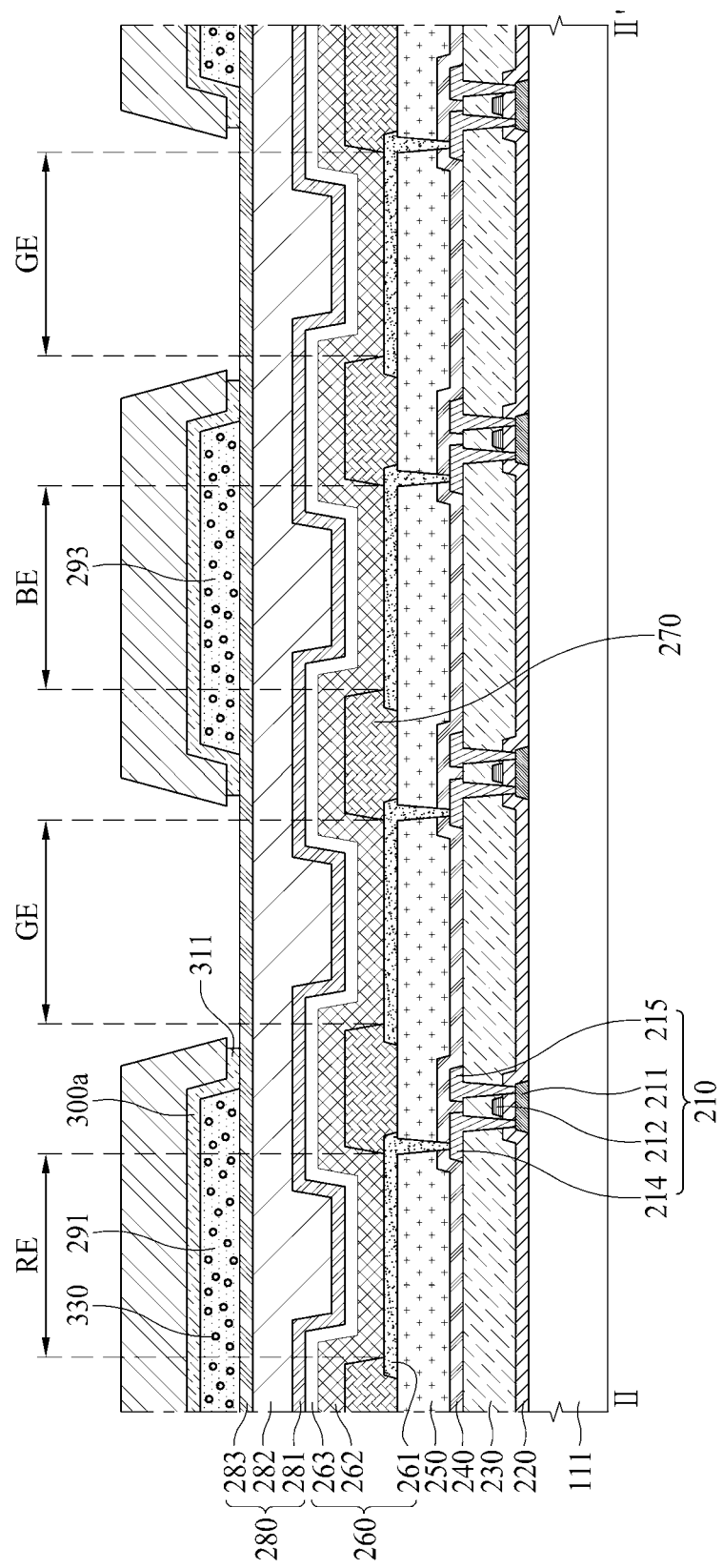

Fifth, as illustrated in FIG. 18C, a part of the reflective metal layer 300a in the area between the first color filter 291 and the third color filter 293 which is exposed without being covered by the photoresist pattern PR may be wet-etched. Since the width W1 of the photoresist pattern PR is adjusted wider than a width W2 of each of the first and third color filters 291 and 293, a tail portion 311 may be added into the reflective metal layer 300a after etching.

Figure 18D:
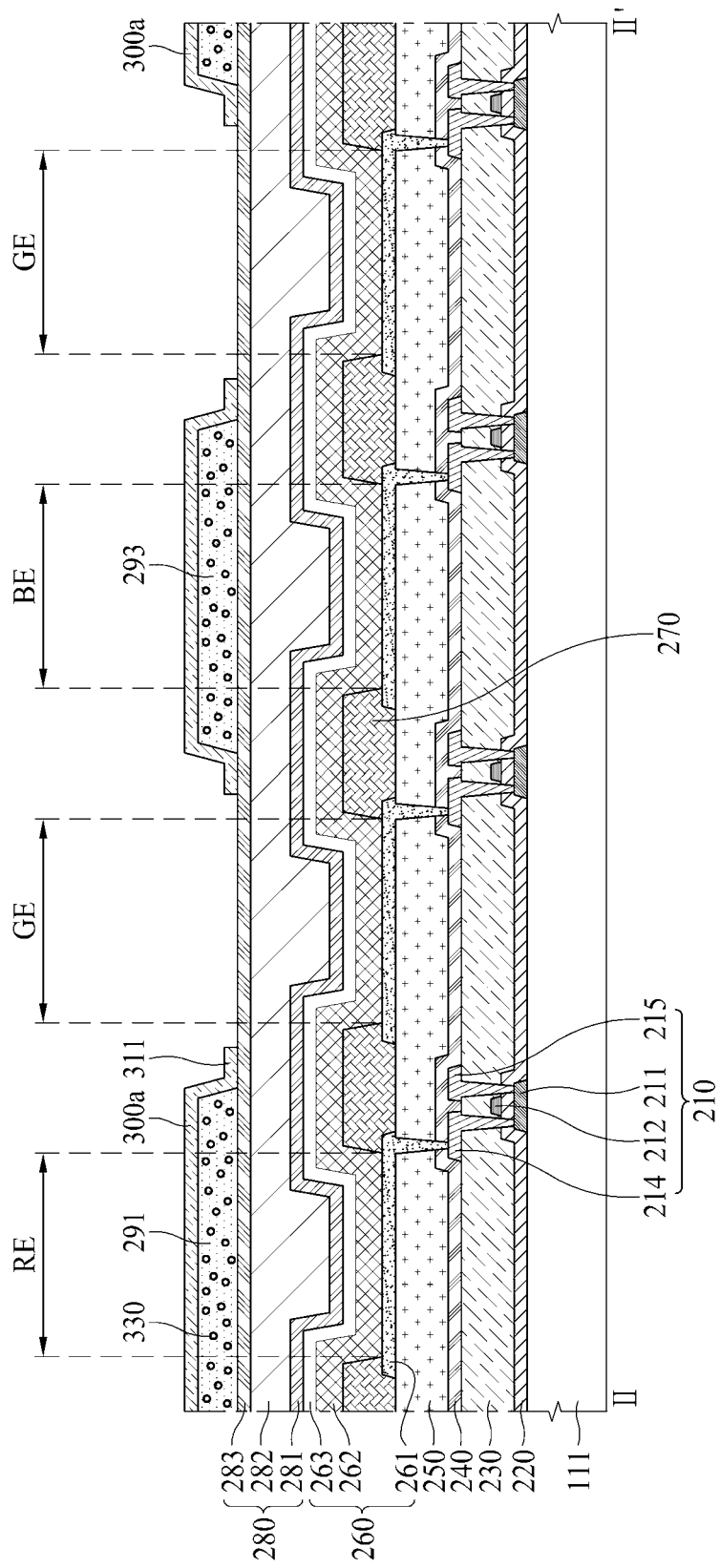

Subsequently, as illustrated in FIG. 18D, the photoresist pattern PR may be removed. (S305 of FIG. 17)

Figure 18E:
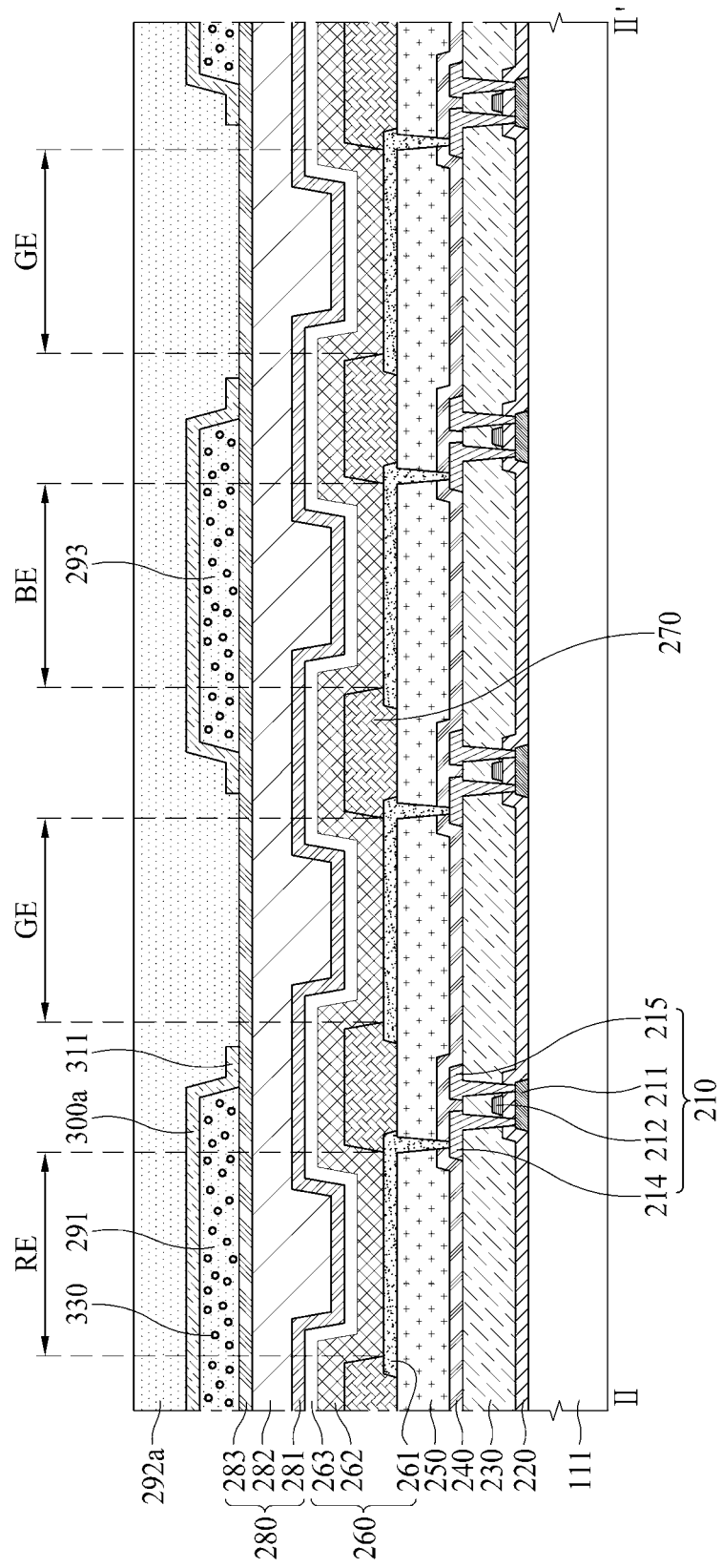
Figure 18F:
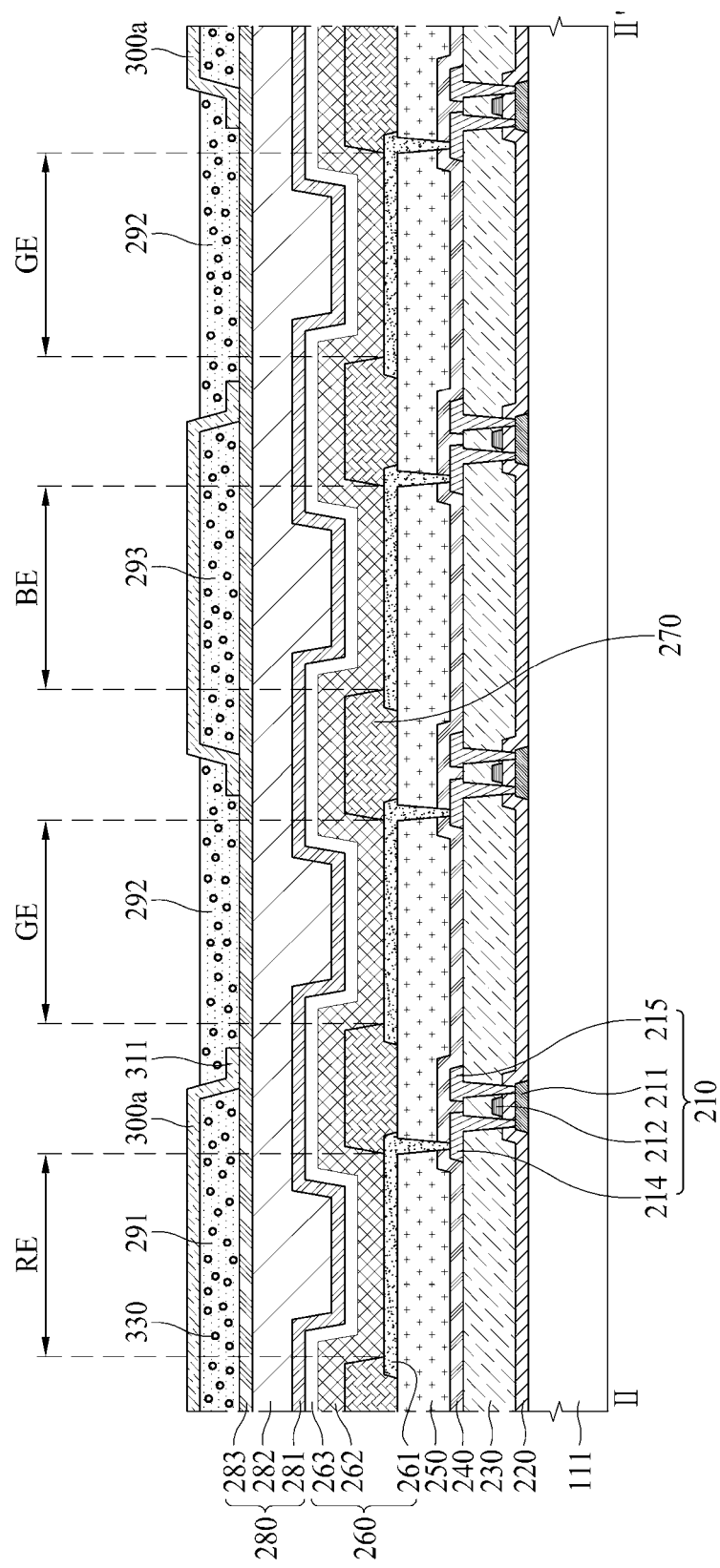

Sixth, as illustrated in FIG. 18E, a second color filter layer 292a may be formed on the reflective metal layer 300a and the encapsulation layer 280 which is not covered by the reflective metal layer 300a. The second color filter layer 292a may be an organic material including a green pigment. (S306 of FIG. 17)

Seventh, as illustrated in FIG. 18E, a second color filter 292 may be formed by etching the second color filter layer 292a through dry etching without a mask.

A material applied to the dry etching may be a mixed gas of $O_2$ and $CF_4$. For example, a weight ratio (wt %) of $O_2$ to $CF_4$ may be 60:150, but is not limited thereto. In a case of dry-etching an organic layer and the reflective metal layer 300a by using the mixed gas of $O_2$ and $CF_4$, the second color filter layer 292a corresponding to an organic material is mainly etched, and the reflective metal layer 300a is hardly etched. That is, the first and third color filters 291 and 293 are protected by the reflective metal layer 300a without being etched.

Moreover, by adjusting a dry etching duration, the second color filter layer 292a may be formed to have a planar surface disposed on the same layer as a planar surface of the reflective metal layer 300a on the first and third color filters 291 and 293. If a dry etching duration is short, the second color filter layer 292a remains on the reflective metal layer 300a, causing color mixing. Also, if the dry etching duration is long, the second color filter 292 is thinned in thickness, and thus, the second color filter 292 cannot normally operate. An appropriate dry etching duration may be previously determined through experiments.

Moreover, the second color filter layer 292a is not protected by the reflective metal layer 300a, but the first and third color filters 291 and 293 are protected by the reflective metal layer 300a. Accordingly, despite adjusting the dry etching duration, a thickness of each of the first and third color filters 291 and 293 is thicker than a thickness of the second color filter 292.

Moreover, the second color filter layer 292a may be formed through dry etching without a mask, instead of a photo process requiring the mask, and thus, the manufacturing cost and a manufacturing time are reduced.

Moreover, since the second color filter layer 292a is not formed through the photolithography process, the second color filter layer 292a may not include a photo initiator.

Furthermore, since the second color filter 292 is formed between the first and third color filters 291 and 293, the second color filter 292 may be formed to have a planar surface disposed on the same layer as a planar surface of the reflective metal layer 300a on the first and third color filters 291 and 293. In other words, a top surface of the second color filter 292 may be level with a top surface of the reflective metal layer 300a. Accordingly, in an embodiment of the present disclosure, an overcoat layer for planarizing step heights of the color filters may not be formed on the second color filter 292 and the reflective metal layer 300a. (S307 of FIG. 13)

Eighth, as illustrated in FIG. 18G, the reflective metal layer 300a on the first and third color filters 291 and 293 may be etched to expose the first color filter 291 and the third color filter 293.

The method of manufacturing shown in FIGS. 17 and 18A through 18G can be similarly applied to the embodiment of FIG. 16B, by replacing the blue subpixel with another red subpixel, and the third color filter 293 with another red color filter 291.

In detail, a photoresist pattern may be formed in an area except the first and third color filters 291 and 293, and then, the reflective metal layer 300a which is exposed without being covered by the photoresist pattern may be wet-etched. Subsequently, the photoresist pattern may be removed. As a result, a top surface of the second color filter 292 may also be level with a top surface of the first color filter 291 and the third color filter 293.

Figure 18H:
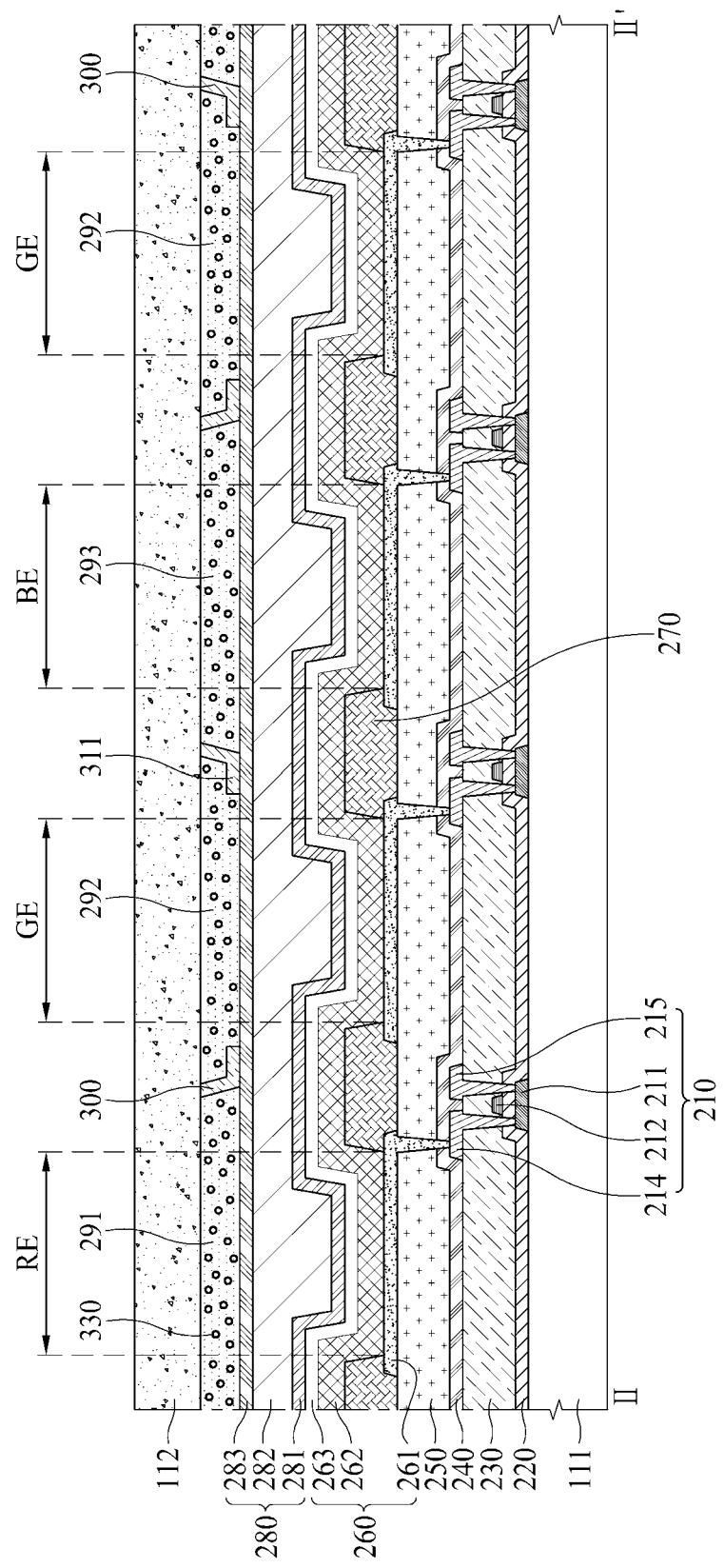

As illustrated in FIG. 18H, a second substrate 112 may be attached on the first to third color filters 291 to 293. The second substrate 112 may be an encapsulation film. (S308 of FIG. 17)

It will be apparent to those skilled in the art that various modifications and variations can be made in the present invention without departing from the spirit or scope of the inventions. Thus, it is intended that the present invention covers the modifications and variations of this invention provided they come within the scope of the appended claims and their equivalents.

What is claimed:

1. A display device comprising:
a first substrate;
a second substrate facing the first substrate;
an array of subpixels disposed on the first substrate, wherein the array of subpixels includes at least a first subpixel and a second subpixel adjacent to the first subpixel;
a first color filter on the first subpixel and a second color filter on the second subpixel, wherein the first color filter is physically separated from the second color filter;
an inorganic layer disposed on the first color filter and the second color filter in a first direction toward the second substrate and in an area between the first color filter and the second color filter; and
a black matrix disposed on the inorganic layer in the same first direction toward the second substrate in the area between the first color filter and the second color filter,
wherein the first color filter, the second color filter, and the black matrix overlap in a second direction different from the first direction.

2. The display device of claim 1, wherein a top surface of the black matrix is level with a top surface of a portion of the inorganic layer disposed on the first color filter and the second color filter.

3. The display device of claim 1, wherein the inorganic layer is formed of at least one of indium tin oxide (ITO), indium zinc oxide (IZO), silicon oxide (SiOx), silicon nitride (SiNx), silicon oxynitride (SiON), and aluminum oxide ($Al_2O_3$).

4. The display device of claim 1, further comprising an encapsulation layer on the first subpixel and the second subpixel, wherein the first color filter and the second color filter are in contact with the encapsulation layer.

5. The display device of claim 1, wherein the first color filter and the second color filter are in contact with the second substrate.

6. The display device of claim 1, wherein each of the first color filter and the second color filter comprises particles that scatter light.

7. The display device of claim 1, wherein a thickness of the black matrix is thinner than a thickness of each of the first color filter and the second color filter.

8. The display device of claim 1, wherein at least a part of the inorganic layer has a concave shape toward a second direction opposite the first direction in the area between the first color filter and the second color filter, and wherein the black matrix is disposed on the part of the inorganic layer to fill the area having the concave shape between the first color filter and the second color filter.

9. A display device comprising:
a first substrate;
a second substrate facing the first substrate;
an array of subpixels disposed on the first substrate, wherein the array of subpixels includes at least a first subpixel, a second subpixel adjacent to the first subpixel, and a third subpixel adjacent to the second subpixel;

an encapsulation layer on the first subpixel, the second subpixel, and the third subpixel;

a first color filter on a first portion of the encapsulation layer on the first subpixel, a second color filter on a second portion of the encapsulation layer on the second subpixel, and a third color filter on a third portion of the encapsulation layer on the third subpixel; and a protective layer disposed between the first color filter and the second color filter, and between the second color filter and the third color filter, and below at least the second color filter, wherein at least a part of the protective layer has a concave shape toward the first substrate in an area between the first color filter and the third color filter, and wherein the second color filter is disposed on the part of the protective layer to fill the area having the concave shape between the first color filter and the third color filter, and wherein one or more of the first color filter, the second color filter, and the third color filter contacts the encapsulation layer.

10. The display device of claim 9, wherein the protective layer is disposed on at least one of the first color filter, the second color filter, and the third color filter.

11. The display device of claim 9, wherein the protective layer is an inorganic layer.

12. The display device of claim 11, wherein the inorganic layer is formed of at least one of indium tin oxide (ITO), indium zinc oxide (IZO), silicon oxide (SiOx), silicon nitride (SiNx), silicon oxynitride (SiON), aluminum oxide ($Al_2O_3$).

13. The display device of claim 9, wherein the protective layer is disposed on at least a portion of the first color filter and the third color filter, and a top surface of the second color filter is level with a top surface of the protective layer disposed on at least the portion of the first color filter and the third color filter.

14. The display device of claim 9, wherein a top surface of the second color filter is level with a top surface of the first color filter and a top surface of the third color filter.

15. The display device of claim 9, wherein the first subpixel and the second subpixel are in a same row of the array of subpixels, and the second subpixel and the third subpixel are in a same column of the array of subpixels.

16. The display device of claim 15, wherein the first color filter emits red light responsive to receiving light from the first subpixel, the second color filter emits green light responsive to receiving light from the second subpixel, and the third color filter emits blue light responsive to receiving light from the third subpixel.

17. The display device of claim 9, wherein the second color filter is in contact with the encapsulation layer.

18. The display device of claim 9, wherein the second color filter is in contact with the second substrate.

19. A display device comprising:

a first substrate;

a second substrate facing the first substrate;

an array of subpixels disposed on the first substrate, wherein the array of subpixels includes at least a first subpixel, a second subpixel adjacent to the first subpixel, and a third subpixel adjacent to the second subpixel;

an encapsulation layer on the first subpixel, the second subpixel, and the third subpixel;

a first color filter on a first portion of the encapsulation layer on the first subpixel, a second color filter on a second portion of the encapsulation layer on the second subpixel, and a third color filter on a third portion of the encapsulation layer on the third subpixel; and a protective layer disposed between the first color filter and the second color filter, and below a first edge of the second color filter adjacent the first color filter, wherein the protective layer is a reflective metal layer.

20. The display device of claim 19, wherein the reflective metal layer is formed of at least one of Ag or Al.

21. The display device of claim 19, wherein the protective layer is disposed between the second color filter and the third color filter, and below a second edge of the second color filter adjacent the third color filter.

22. The display device of claim 19, wherein a thickness of the second color filter is less than a thickness of the first color filter.

* * * * *